United States Patent
Valmiki et al.

(10) Patent No.: US 7,200,703 B2
(45) Date of Patent: Apr. 3, 2007

(54) CONFIGURABLE COMPONENTS FOR EMBEDDED SYSTEM DESIGN

(76) Inventors: Ramanujan K. Valmiki, Villa #23-1, Adarsh Palm Meadows, Airport Varthur-Whitefield, Ramagundahalli, Bangalore (IN) 560066; Ashok Halambi, 865, 20 C Main, 8 Block, Koramangla, Bangalore (IN) 590095; Madhuri Mandava, D/O Late Dr. C. Mastan Rao, G/A Lakhsmi Apts., Peda Waltair, Vishakapatnam (IN) 530017; Seru Srinivas, #43, 4th Cross, Marenahalli, 2nd Phase, JP Nagar, Bangalore (IN) 560078; Shashank Dabral, C/o Dr. Mahavir Dabral, #601, Kalyan Apartments, Sector-24, Indira Nagar, Lucknow (IN) 560034; Marimuthu Kumar, S/o C.K. Murugan, 5/29, Kandhan Illam, Golden Nagar, Bharathiar University, Coimbatore (IN) 560034; Bill Safelski, 1081, Camino Ricardo, San Jose, CA (US) 30339

( * ) Notice: Subject to any disclaimer, the term of this patent is extended or adjusted under 35 U.S.C. 154(b) by 141 days.

(21) Appl. No.: 10/863,550

(22) Filed: Jun. 8, 2004

(65) Prior Publication Data
US 2005/0273542 A1 Dec. 8, 2005

(51) Int. Cl.
*G06F 13/00* (2006.01)
(52) U.S. Cl. .................................. 710/306; 712/29
(58) Field of Classification Search ........ 710/305–317, 710/8–19, 22–31, 36–38; 716/1, 12, 16–18; 712/16–22, 28–31
See application file for complete search history.

(56) References Cited

U.S. PATENT DOCUMENTS

| | | | | |
|---|---|---|---|---|
| 5,799,203 | A * | 8/1998 | Lee et al. ...................... 710/8 |
| 5,867,400 | A * | 2/1999 | El-Ghoroury et al. ......... 716/1 |
| 6,438,737 | B1 * | 8/2002 | Morelli et al. ................ 716/16 |
| 6,459,644 | B2 * | 10/2002 | Mizushima et al. ... 365/230.01 |
| 6,477,691 | B1 * | 11/2002 | Bergamashi/Rab et al. ... 716/12 |
| 6,591,403 | B1 * | 7/2003 | Bass et al. ..................... 716/5 |
| 6,952,816 | B2 * | 10/2005 | Gupta et al. .................. 716/18 |
| 7,020,764 | B2 * | 3/2006 | Kubota et al. ................ 712/37 |
| 7,024,654 | B2 * | 4/2006 | Bersch et al. ................ 716/16 |
| 2001/0025363 | A1 | 9/2001 | Ussery et al. .................. 716/1 |
| 2003/0120460 | A1 | 6/2003 | Aubury ..................... 702/182 |
| 2003/0126563 | A1 | 7/2003 | Nakajima ...................... 716/1 |

\* cited by examiner

*Primary Examiner*—Mark H. Rinehart
*Assistant Examiner*—Raymond N Phan
(74) *Attorney, Agent, or Firm*—Ash Tankha; Lipton, Weinberger & Husick

(57) ABSTRACT

A system and method of designing an accelerator for a processor-based system. The accelerator design problem is partitioned into a data communicate module design problem and a data compute core module design problem. The hardware design of the data communicate module is achieved through a predetermined communication template which is customized for the particular application. The communication template has individual configurable communication components and a programmable control flow path. The components of the communicate template include a host bus interface, a memory bus interface, a direct memory access, a local memory and a control module. The combination of the communication components in a single configurable communication template and their optimized interconnections increase the speed of data transfer and data control processes in the accelerator. The hardware design of the data compute core module can be achieved through custom hardware design or by automatically generating hardware from software description.

9 Claims, 21 Drawing Sheets

| COMPONENTS OF COMMUNICATION TEMPLATE | CUSTOMIZABLE OPTIONS OF EACH COMPONENT |
|---|---|
| LOCAL MEMORY UNIT (RAM#1, RAM#2, RAM#3...) | TOTAL ADDRESS SPACE (ADDRESS MAP SIZE)<br>NUMBER OF RAM BANKS<br>SIZE OF EACH RAM BANK<br>LOCAL ADDRESS OFFSET FOR EACH RAM BANK<br>NUMBER OF PORTS<br>TYPE OF EACH PORT (READ, WRITE, READ-WRITE)<br>READ LATENCY FOR READ AND READ/WRITE PORT<br>WRITE LATENCY FOR WRITE AND READ/WRITE PORT<br>READ-WRITE DATA SPLIT (YES/NO) (TWO DIFFERENT BUSES FOR READ AND WRITE) |
| DMA | NUMBER OF CHANNELS<br>BURST SIZE LIMIT FOR EACH CHANNEL (8,8,16,ETC)<br>ADDRESS LIST HARDWARE (YES/NO)<br>DMA CHANNEL MODES (STRIDE, OFFSET, USER DEFINED) |
| EXTERNAL INTERFACE | NUMBER OF INTERFACES<br>RECEPTOR INTERFACE COUNT<br>INITIATOR INTERFACE COUNT<br>BUS INTERFACE PROTOCOL STANDARD (AMBA, OPB, ETC.)<br>ADDRESS BUS WIDTH<br>DATA BUS WIDTH<br>SINGLE OR MULTIPLE CLOCK DOMAINS<br>FREQUENCY OF OPERATION |
| CCU | SINGLE STEP SUPPORT (YES/NO)<br>READ,WRITE,READ-WRITE CONFIGURATION FOR PORTS<br>READ-WRITE DATA SPLIT (YES/NO) (TWO DIFFERENT BUSES FOR READ AND WRITE)<br>READ/WRITE LATENCY<br>READ STROBE (YES/NO)<br>NUMBER OF CONCURRENT OPERATIONS (NUMBER OF THREADS) |

FIG. 3

```
// Sample application snippet
// Two input data arrays are used to produce an output array
// The DSP equivalent expression is
// for i=0 through to 87, z[i] = x[i]*c1 + y[i]*c2;
// Primary inputs
   int c1, c2;      // Received through receptor transfer
   int x[88], y[88]; // DMA input
// Primary output
   int z[88];       // DMA output
// Local Loop Variables
   int i;
// Compute loop
   for (i=0; i<=87; i++) {
   z[i] = x[i]*c1 + y[i]*c2; }
```

FIG. 4

CONFIGURABLE COMPONENTS FOR EMBEDDED SYSTEM DESIGN

BACKGROUND OF THE INVENTION

The present invention relates, in general, to the hardware-software co-design of processor-based embedded systems and more particularly, to the method for design of accelerators.

Contemporary embedded system design involving programmable components, are rapidly increasing in complexity in terms of the functionality provided and also the hardware and software components required. For example, mobile phones with integrated Wireless Application Protocol (WAP), audio, video and Personal Data Assistant (PDA) features require complicated software and hardware architectures. Such systems require the designer to provide the best performance for the lowest possible cost under the constraints of short time-to-market and flexibility for incorporation of changing standards.

System designers are under constant pressure to increase the functionality of embedded systems in order to meet the increasing demand for new applications. Design solutions need to achieve higher performance in execution time, and to simplify and modularize the design process of processor-based embedded systems. Developing new processor architectures or modifying existing ones, requires significant time and also incurs significant cost and effort. Accelerators are used as an add-on to existing designs to remove application bottlenecks, thereby obviating the need for an expensive redesign of the entire architecture of the processor-based system. This invention focuses on a method to improve the performance of existing platforms, with minimal incremental time and effort expenditure.

Design challenges in processor-based systems have been addressed in the following patents and design approaches. Before the current design methods, it is important to understand the differences between an accelerator, co-processor and application specific processor.

The application specific processor has a uniquely tailored instruction set, which is automatically derived to suit the target application. The instruction set is broad and covers a varied set of functions. The accelerator is designed to perform only a single function or a set of few functions. It does not have an instruction set with the capability to perform multiple functions in a very adaptive way. The application specific processor has to be programmed to derive the relevant application set when the application is called. Whereas, an accelerator is specifically called to execute a particular function, there is no need to program or configure it in any elaborate way. The co-processor assists the main processor by performing certain special functions. It performs the function faster than the main processor. The main processor would have executed the function in software, using its generic instruction set whereas the co-processor executes the function in predetermined hardware. The co-processor often decodes instructions in parallel with the main processor and executes only those instructions intended for it.

The thrust of the existing solutions is on optimizing the data computational task of the design process. This invention is directed to an accelerator design task comprising a data communicate and data compute task, and to an electronic design automation tool that specifically optimizes the data communicate design task using a template based approach for hardware synthesis. The template here refers to both the components and the control flow path among the components. The template consists of a configurable and programmable data communicate module and a configurable interface to a data compute module.

As the complexity of system-on-chip (SoC) devices continue to increase, the market pressures continue to dictate shorter design cycles. In the past, there was a clear demarcation between generic instruction set processors and Application Specific Integrated Circuits (ASIC). In the case of ASIC's, the algorithms are implemented for the most part in hardware. ASIC designers do not prefer to implement intensive algorithms by "running" software. In contrast, most of the SoCs have one or more instruction set processors in addition to a huge block of custom logic. Thus both the software design complexity and hardware design complexity need to be addressed simultaneously.

An approach for hardware-software co-design in processor-based systems is to use Application Specific Processors (ASP). The ASP design approach is effective when the application design lends itself to a small library of application syntaxes and predictable applications. However, it is not an efficient method for the design of processor based systems where it is difficult to predetermine radically new applications. Further, such existing solutions do not specifically focus on optimizing the communication tasks by the use of a configurable communication template.

Another approach for hardware-software co-design in processor-based systems is to focus on designer configurable computational units. Performance is enhanced by parallel processing the computational units. The present invention defines a process by which the template is optimized and also the process of customizing the control flow path for the particular application.

Another approach for hardware-software co-design in processor-based systems is to generate an integrated circuit that includes a software configurable component and a fixed hardware component. Hardware-software partitioning is approached in the context of overall processor system design. However, the thrust of the present invention is on using the partitioning approach in the communication module.

Still another approach for hardware-software co-design in processor-based systems involves electronic design using a library of programmable co-processors. This broad approach can be used in applications where limited configurability is expected, typically in applications requiring minimum design upgrades. However, in the design of complex applications with decreasing design cycle times, it is difficult to anticipate all the co-processor blocks that will be required. The customizable feature of the present invention's template is an improvement over the prior art.

The market therefore requires an optimized design solution for the communication components and the data path in the accelerators and co-processors. The "optimized design solution" herein refers not only to a faster and less complex method of design, but also to improved cycle time performance.

SUMMARY OF THE INVENTION

The present invention is related to the design and implementation of an accelerator of a processor-based system using a configurable communication template. The configurable communication template comprises a configurable host bus unit, configurable local memory unit, configurable memory bus unit, configurable direct memory access unit and a configurable and programmable control unit.

The configurability of the configurable communication template simplifies the accelerator design process and the combination of all the communication components in a single configurable communication template increases the speed of data transfer and speed of data control processes in the accelerator.

It is an object of the present invention to migrate the communication bottlenecks from the core processor to dedicated hardware. The dedicated hardware is an accelerator residing on the system bus. The accelerator designed by a template based approach can bring about orders of magnitude improvement in performance, while still retaining the cost/flexibility benefits of using standard processor cores.

It is another object of the present invention to reduce the complexity of accelerator hardware design through the use of a customizable template. The present invention describes a method of designing a hardware accelerator used in hardware and software co-design.

It is another object of the present invention to reduce the complexity of the accelerator design process through the use of pre-designed configurable components together with a programmable control module. The configuration of the components can be decided by analysis of the application(s), and the control module can either be programmed manually or through automatic means.

It is another object of the present invention to improve the cycle time performance of the overall processor system. The optimized template architecture improves the cycle time performance of the overall processor system. The architecture of the accelerator consists of a configurable communication module, an optimized control flow sequencer for interactions among the communication components in the communication module and a custom software generated data compute module, embedded inside the communications wrapper. The components and flow sequence in the data communication template is configured as per the requirements of the user application.

It is another object of the present invention to economize the procedure for design upgrades in existing processor-based embedded systems. The template solution obviates the necessity to recreate the core processor for each design upgrade. Therefore, based on a given new application, the key hardware features of the accelerator communication template are reconfigured and data compute module generated to meet the requirements of the given application. The template solution therefore economizes the design procedure.

The present invention aids the system designer in improving the performance of the processor-based systems. Current processor-based platforms are inadequate to satisfy the demands of increasing complexity of embedded system applications and stringent real-time performance constraints. However, developing new processor architectures, or modifying existing ones, incurs significant cost and time. This invention helps the designer to improve the performance of existing platforms with minimal time and effort expenditure. The application is profiled for communication and computation bottlenecks and the bottlenecks are migrated from the core processor to dedicated hardware. The accelerator designed specifically for the application can bring about orders of magnitude improvement in performance.

BRIEF DESCRIPTION OF THE DRAWINGS

The above and further advantages of this invention can be understood by referring to the following drawings in conjunction with the accompanying description, in which like numerals indicate like structural elements and features in various figures.

FIG. 3 illustrates the configurable options of the communication template.

FIG. 4 illustrates the execution of a sample application snippet by the accelerator.

DETAILED DESCRIPTION OF THE INVENTION

Figure 1:
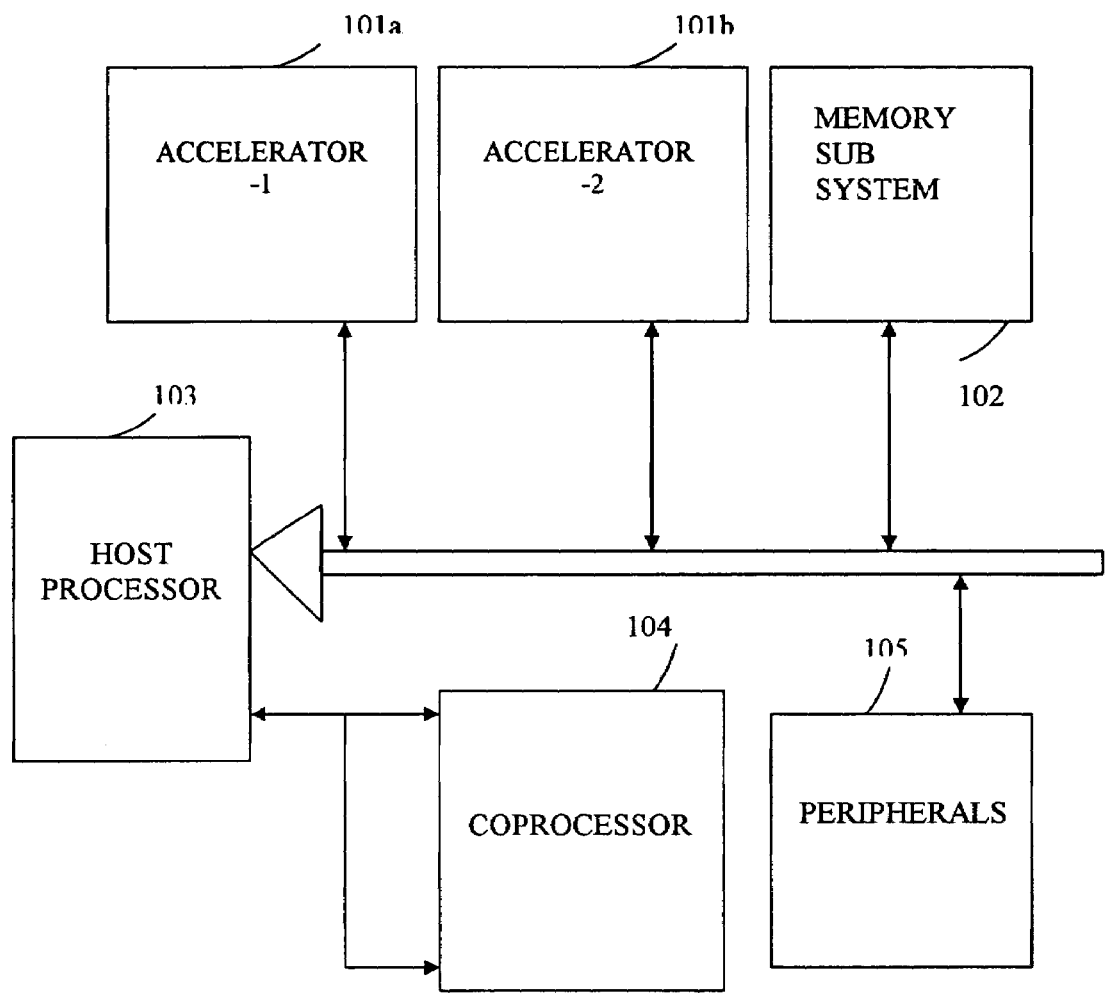
FIG. 1 illustrates the positioning and interfaces of the accelerator within the processor system architecture.

The architecture of a processor-based system consisting of a memory 102, host processor 103, co-processor 104 and peripheral 105 is illustrated in FIG. 1. The accelerators 101*a* and 101*b* are add-ons to the existing design in order to remove application bottlenecks, thereby obviating the need for an expensive redesign of the entire architecture of the processor-based system.

Figure 2:
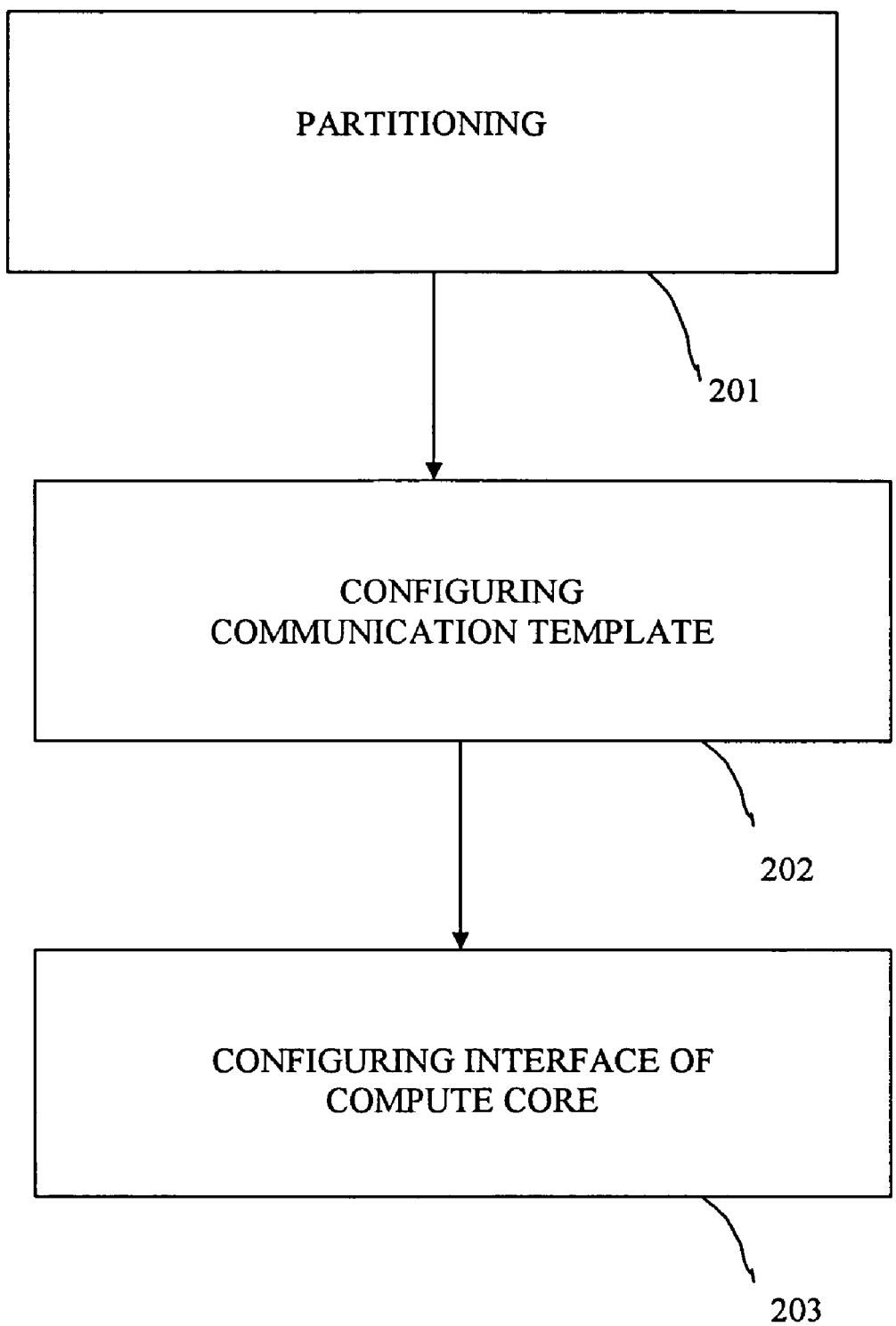
FIG. 2 illustrates the method of accelerator design.

FIG. 2 illustrates the method of accelerator design. The software bottleneck in the application that requires optimization is run through a partitioning process 201. The partitioning process 201 involves various optimizations and analysis of identified performance critical parts of input application. These optimizations and analysis are used to create device drivers for accelerators and emitting C code for a "C to RTL" tool. Compiler infrastructure is used to perform the analysis and optimizations. This step helps the input C code algorithm to be tuned for use with the hardware accelerator. The software partitioning gives a C code to the user for conversion to RTL code by taking care of all the limitations of such conversion. It greatly enhances the performance of the application by optimizing the code for accelerator.

The accelerator consists of a data communicate module and a Compute Core Unit 509. The data communicate module is generated by configuring the communication template 202. The computational functions are executed by configuring the compute core 203. The customizable options of the communication template and the interface of the compute core unit are listed in FIG. 3. The control flow path in the communication template is also configurable.

Applications written in the American National Standards Institute approved C Language (ANSI C) are profiled and custom hardware is generated for speeding up the execution of the applications. Synthesizable code in Register Transfer Level of Hardware Definition Language (RTL-HDL) is generated with the proper interfaces to be able to connect to the system. Software code (in ANSI C) is also generated for a device driver that interfaces to the generated hardware. The application is profiled at various levels of granularity such as instruction-level, loop-level, and function-level.

Figure 5:
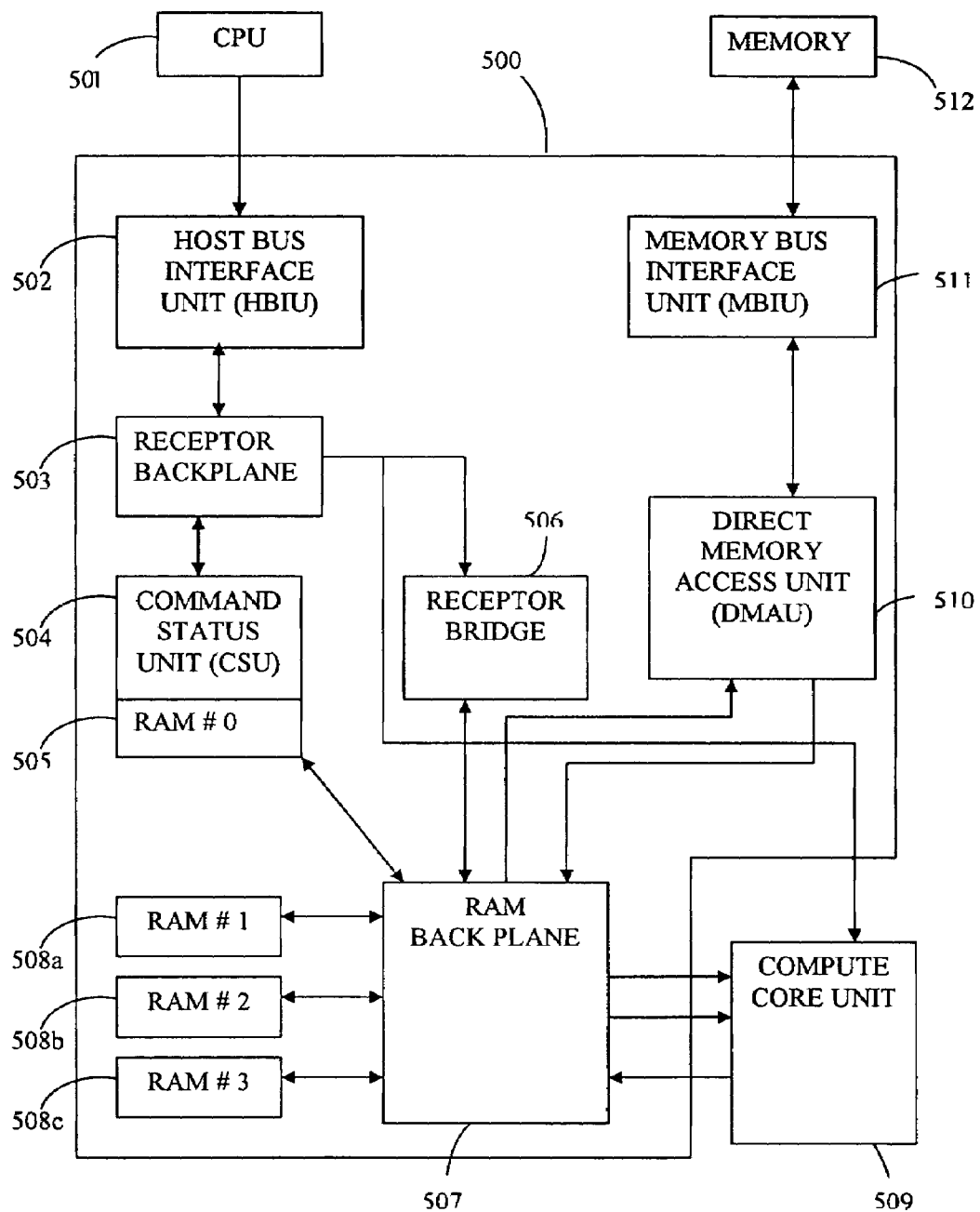
FIG. 5 illustrates the basic connectivity of the functional blocks.

FIG. 5 illustrates a block diagram of configurable communication template 500 architecture of the present invention. The configurable components in the communication template, their interconnections and their interface to the compute core unit (CCU) 509 are illustrated in FIG. 5. The communication template 500 includes a configurable Host Bus Interface Unit (HBIU) 502 connected to the Central Processing Unit (CPU) 501 through a Host CPU Bus. CPU 501 is the Host Processor. The configurable options of the configurable HBIU are listed in FIG. 3. Configuring the Host Bus Interface Unit HBIU 502 includes setting a receptor interface count, setting an initiator interface count, selecting a bus interface protocol standard, setting an address bus width, setting a data bus width and setting a number of clock domains. For example, in the case of a discrete wavelet transform application, the receptor interface count is set to 1, the initiator interface count is set to 1, bus interface protocol is On-Chip Peripheral Bus (OPB), the address bus width is set to 32, data bus width is set to 32 and number of clock domains is 1. The configurabilty of the interfaces provides easy portability of the accelerator across different bus architectures. For example, the same accelerator for the above example of discrete wavelet transform can be used across On Chip Peripheral bus platform or ARM High Performance Bus Platform by changing the bus interface protocol standard. The configurable communication template 500 is designed to support up to two distinct external buses. One bus termed 'Host CPU bus' is used by the host CPU for control/data traffic to and from communication template 500 and the other, when available, is for unobtrusive high speed Direct Memory Access Unit (DMAU) traffic with the memory controller 512. The primary bus interface provides communication between CPU 501 and communication template 500. The primary bus interface is a pure receptor interface for transfers initiated by the host, to/from the communication template unit 500. However, when the second bus interface, meant for DMAU, is not used, this primary bus interface will have the option to be extended to support an initiator mode, for performing DMAU transfers. The second bus interface (an initiator interface) is an option, to enable more direct and rapid access to memory 512, for DMAU operations. This interface is likely to support and use one of the popular SoC-System (System-on-Chip) backplane buses such as Open Core Protocol (OCP) of Sonics Inc, Advanced Microcontroller Bus Architecture (AMBA), Advanced RISC Machine (ARM) of ARM Inc., Advanced High-Performance Bus (AHB), or Core-connect of IBM Inc. The implementation and the choice of the second bus interface is conditional to the availability of such a bus in the system into which the communication template is being implemented. In the absence of this choice, the primary bus interface will optionally be converted to an initiator-receptor interface, enabling routing of DMAU traffic to that interface. Receptor operations are not supported through the Memory Bus Interface Unit (MBIU) 511.

Configurable HBIU 502 manages the stated interfacing between the CPU 501 and the communication template 500. The HBIU 502 is usually a pure-receptor interface, with the option of being used as an initiator receptor interface. HBIU 502 is the primary external bus interface, through which the communication template 500 interfaces to the CPU 501. All the receptor communications, initiated by the CPU 501, are directed through this bus. Different drop-in versions of the HBIU 502 will be available to suitably support specific host-processor busses, such as the AMBA (ARM). Irrespective of the version of HBIU 502 deployed, the internal interface of the HBIU 502 will always be consistent, with an ability to permit both receptor and initiator transactions through the HBIU 502. HBIU 502 is connected to the command status unit 504 through a receptor backplane (RCP-BKPL) 503. HBIU 502 is connected through the receptor backplane 503 to the receptor bridge (RCP-BRDG) 506. HBIU 502 can reach the Random Access Memory (RAM) backplane 507 through the receptor bridge. HBIU 502 can communicate with the CCU 509 through receptor backplane 503 that facilitates the transfer of data from CPU 501 to the Compute Core Unit (CCU) 509 through a bus.

Configurable Memory Bus Interface Unit (MBIU) 511 manages the second mode of interfacing, which is a pure-initiator interface, dedicated for DMAU 510 transfers to and from the memory 512. The configurable options of MBIU 511 is provided in FIG. 3. Configuring the memory bus interface unit includes setting a receptor interface count, setting an initiator interface count, selecting a bus interface protocol standard, setting an address bus width, setting a data bus width, setting a number of clock domains and setting a number for interfaces. For example, for a discrete wavelet transform application, the receptor interface count is set at 1, the bus interface standard is On-Chip Peripheral Bus (OPB) and the bus width is 32 bit. MBIU 511 is an optional second external bus interface, to enable a high-speed channel to conduct DMAU operations, increasing the efficiency of memory traffic handling. Irrespective of the version of MBIU 511 deployed, the internal interface of the MBIU 511 will always be consistent, with an ability to permit initiator transactions through the MBIU 511. MBIU 511 can establish connection only with the local memory units RAM #1 508*a*, RAM #2 508*b*, RAM #3 508*c* through RAM backplane 507.

The configurable Direct Memory Access Unit (DMAU) 510, is in effect a built-in DMAU controller device, with abilities specific to the actual requirements of communication template 500. The configurable options of DMAU 510 is provided in FIG. 3. The method of configuring DMAU 510 includes setting a number for channels, setting a burst size limit for each said channel and setting a direct memory access channel mode. For example, in the case of discrete wavelet transform application, the number of channels is set at 4. DMAU 510 of this invention is more optimal than a generic DMAU controller without any unwanted hardware. DMAU 510 supports one or more features that may not be normally available features in general-purpose DMAU agents, such as virtual to physical address translation capability using a local translation table. A DMAU unit can take control command signals from CSU 504 and send acknowledgement signals to the CSU 504. Also it can access the local memory through RAM backplane.

The Command Status Unit (CSU) 504 is the local manifestation of a central control and coordinating authority, within communication template 500. Initialization of CSU 504 is done through a command packet submitted by the host software and referred to as Hardware dependent Software (HdS). After getting initialized, the CSU 504, switches to initiating a sequence of activities, by working with the DMAU 510 on one side and CCU 509 on the other side, setting up and triggering the data flow activities within each and reverting back to the CPU 501 with completion status.

RAM#1 508a, RAM#2 508b, RAM#3 508c is the set of local memories. This unit helps to identify the storage elements local to the communication template 500 under one head. The local memory units may contain an amalgam of single-port, 2-port or dual-port RAMs 508a–508c or register-files, based on the communication template 500 generation time choices, traceable to those directed by the user. Configuring the local memory units includes setting a total memory size, setting a number for random access memory banks, setting a size for each of said random access memory banks, setting a local address offset for the random access memory banks, setting a number for ports to be used for data transfer, setting a type for ports, configuring read and write latencies for said ports and setting a number for buses required for read and write operations. For example, in the case of a discrete wavelet transform application, the total memory size is 8 Kilo Bytes (KB), size of each random access memory bank is 2 Kilo Bytes, number of data transfer ports is 16, read latency is 1 cycle and write latency is 1 cycle, there are 7 buses for read and write operations. Of the 16 ports, 9 ports are accessor ports and 7 are target ports.

The Compute Core Unit CCU 509 performs the computational functions. Configuring the compute core unit includes choosing a single step support, setting a read, write and read write configuration for ports, setting a read write data split, setting a read or write latency, choosing a read strobe and setting a number for concurrent operations. For example, in the case of a discrete wavelet transform application there are 4 read write ports and there is support for single stepping, there are no read write data splits, read strobe and concurrent operations.

FIG. 4 illustrates the execution of a sample application snippet by the accelerator. The following example describes the flow of data or parameters, execution and storing of the results of computation.

The two integers c1 and c2 are received through receptor transfer. It is derived from the communication template unit 500 via a primary bus interface to the CCU 509, through a direct write by the driver software (HdS) to the register/storage space inside the CCU 509. These two variables are not routed through the local RAM #1 storage 508a. CSU 504 initiates the DMAU 510 to start read operations of the arrays x[i] and y[i]. DMAU 510 starts by requesting bus access for memory read operations. Once access is granted, the DMAUs start fetching x[i] and y[i] from main memory and transferring it to local storage memory RAM #1 508a in the accelerator. CSU 504 triggers the CCU 509 to initiate the computational process using the data stored in local memory storage 508a. CCU 509 fetches the values of x[i] and y[i] from RAM #1 508a computation. CCU 509 is ready to start operation of the following equation once data is available.

$$z[i]=x[i]*c1+y[i]*c2.$$

After the operation, CSU 504 checks for end-loop condition at CCU 509. In this part of the sequence, CSU 504 checks for any iterations remaining in the loop. If the loop count were less than three, the steps of the entire sequence would repeat.

After the operation of the command in CCU 509, CSU 504 issues a command to write the value of z[i] to the RAM #1 508a. DMAU 510 requests a bus access for memory write operation. Once access is granted, DMAU 510 starts fetching data from local memory RAM #1 508a and writes it to the memory 512.

The unique control flow sequence of this invention decreases the time for execution of the control snippet. This particular control snippet has realized an improvement in speed of operation of approximately 500%.

FIG. 6 to FIG. 21 describe an example of a control flow sequence operation.

Figure 6:
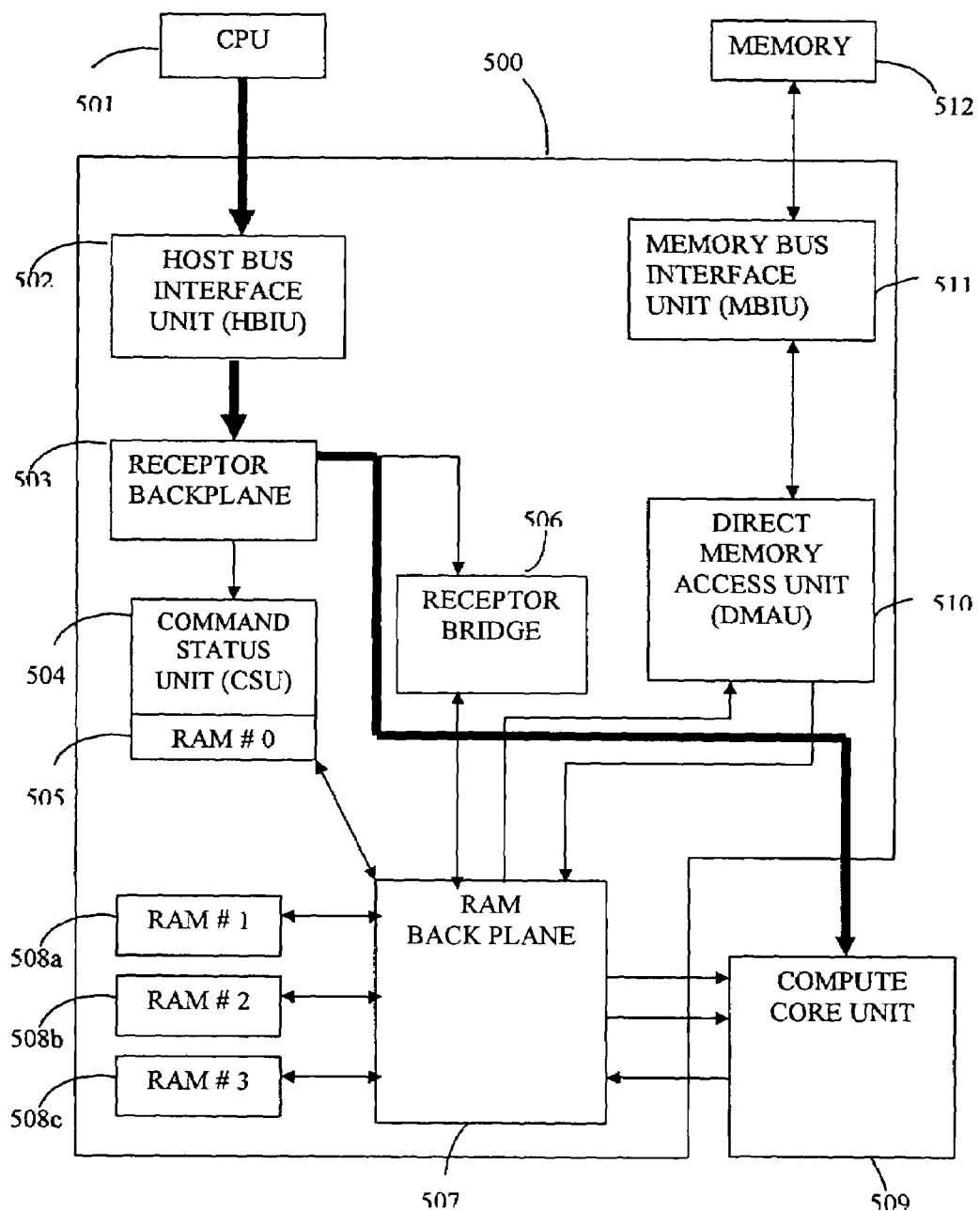
FIG. 6 illustrates the updating of receptor variables C1 and C2 into Compute Core Unit (CCU) by the Host/Driver.

FIG. 6 illustrates the CPU 501 updating the variables into the compute core unit 509 through the receptor backplane 503 of the accelerator. Coefficient inputs c1 and c2 are two variables that are presumed to be made directly available in the beginning to the compute core 509, through a direct write by the driver software (HdS), to register/storage space inside the CCU 509. These two variables are not routed through the local RAM storage (RAM 508a, RAM 508b and RAM 508c).

Figure 7:
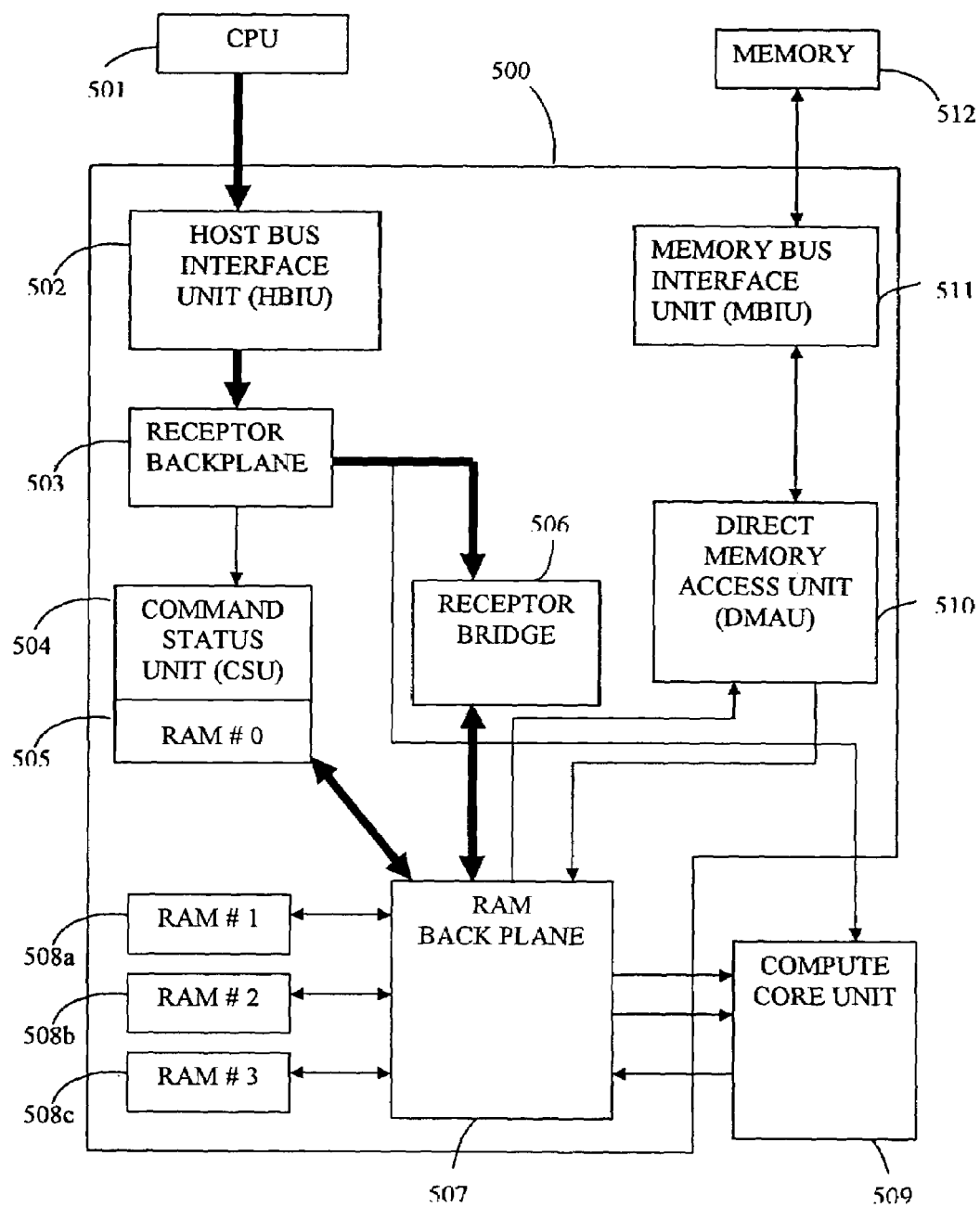
FIG. 7 illustrates the download of control code snippet to Command Status Unit (CSU) by the Host/Driver.

FIG. 7 illustrates the download of control code snippet to command status unit CSU 504 by the CPU 501. CPU 501 downloads Control Command sequences to command status unit CSU 504 through receptor interface unit HBIU 502 and local RAM storage 508. The command status unit 504 now has to allow the control sequence information required to drive accelerators 101a, 101b illustrated in FIG. 1 for the completion of the desired activity.

Figure 8:
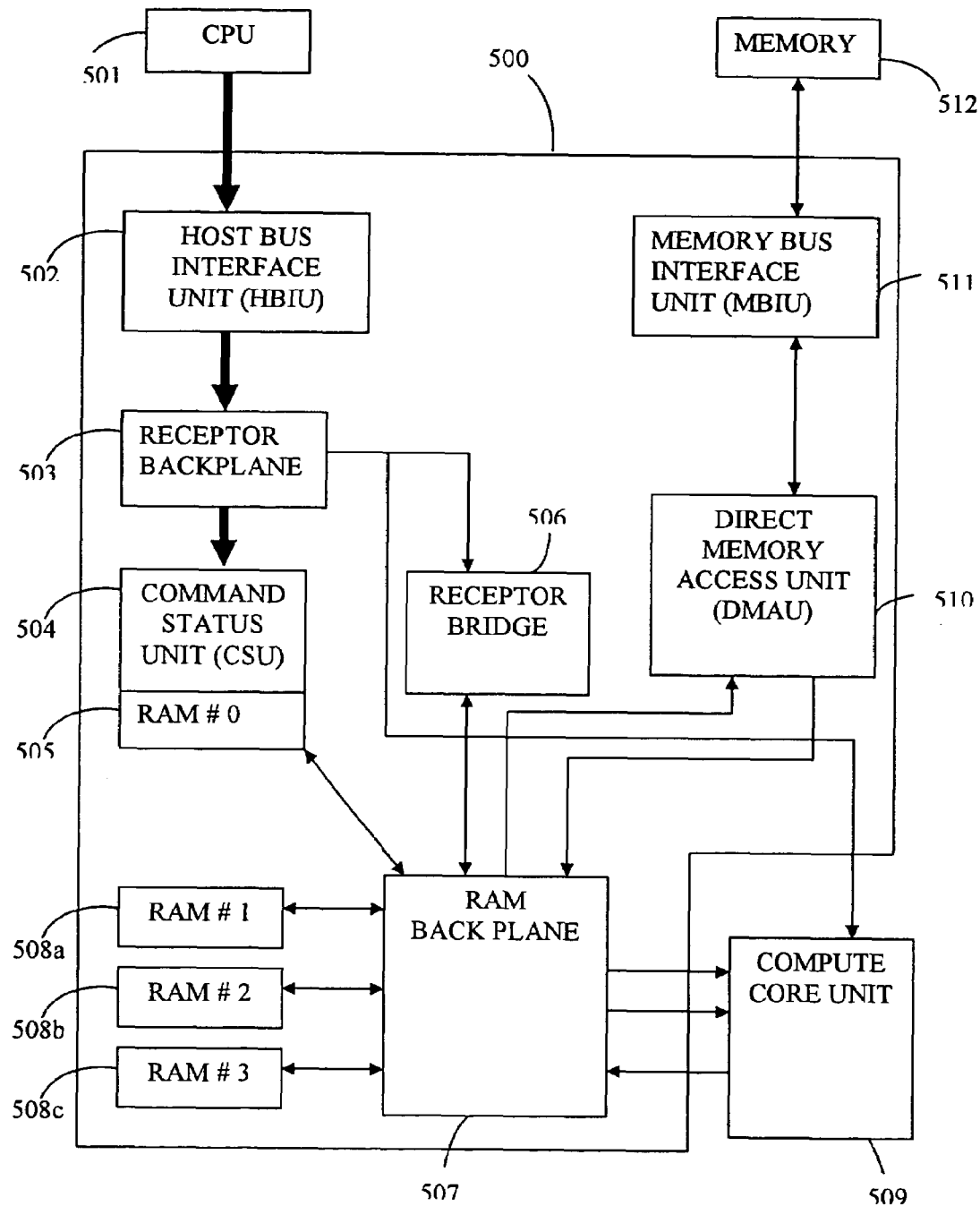
FIG. 8 illustrates the initialization and triggering of CSU by the Host/Driver to start operating.

FIG. 8 illustrates the initialization and triggering of CSU 504 by the CPU 501 to start the operation. CPU 501 triggers command status unit 504 to start the operation through a receptor variable strobe initiated through the receptor interface unit HBIU 502.

Figure 9:
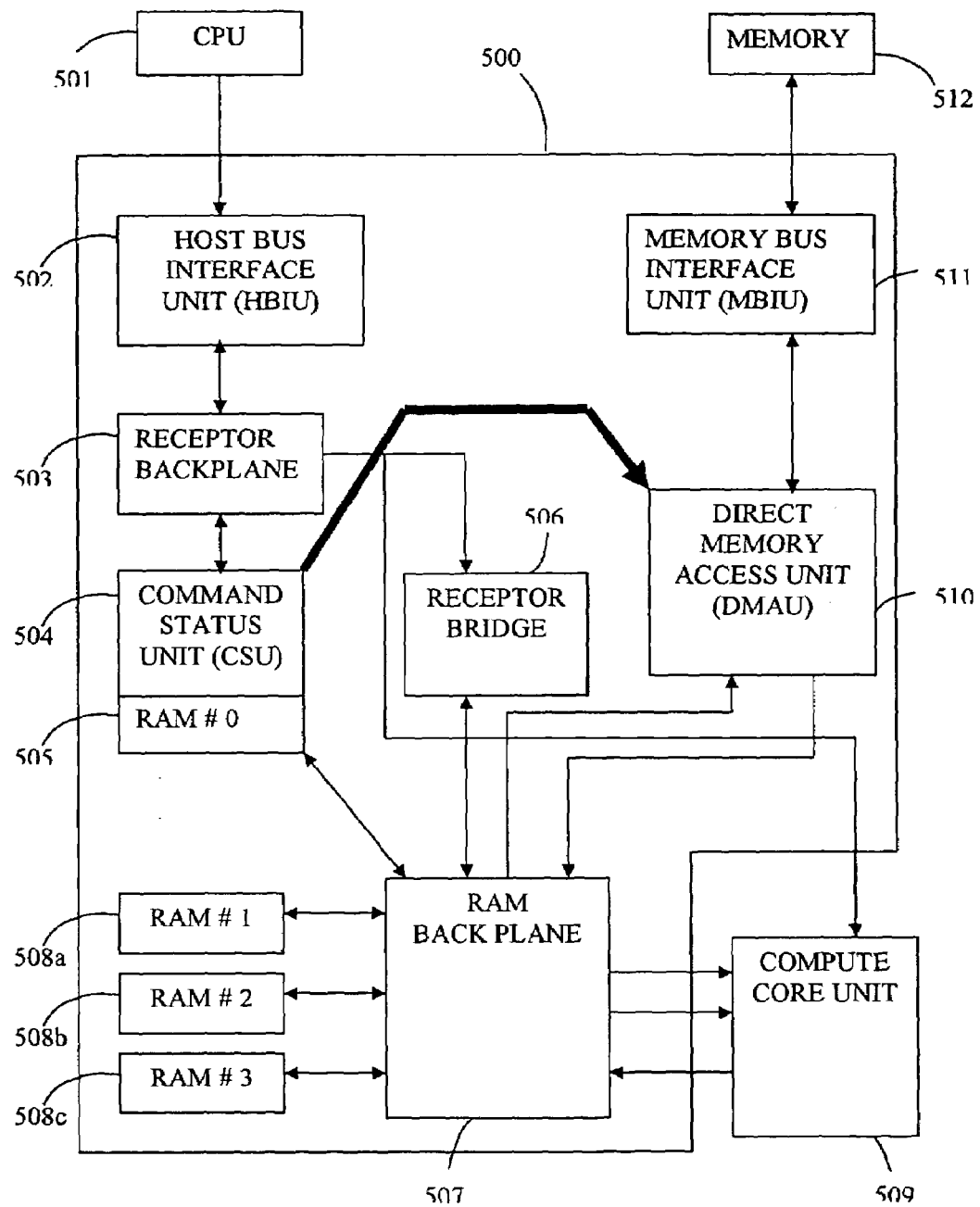
FIG. 9 illustrates the initialization of three Direct Memory Access Unit (DMAU) channels by the CSU.

FIG. 9 illustrates the initialization of three DMAU channels by CSU 504. Command Status Unit 504 initializes operations to be performed by DMAU unit 510 with required parameter settings. This activity initializes all the DMAU parameters like memory addresses, to allow data to be fetched from memory addresses to write data to and for, any priority modes for channels. The presumption here is that the communication template 500 was derived to contain a DMAU 510 with three channels, two dedicated to read the two input arrays and one for writing the output array. In this example, all three arrays are operated as single-buffers inside the local storage and not as double buffers.

Figure 10:
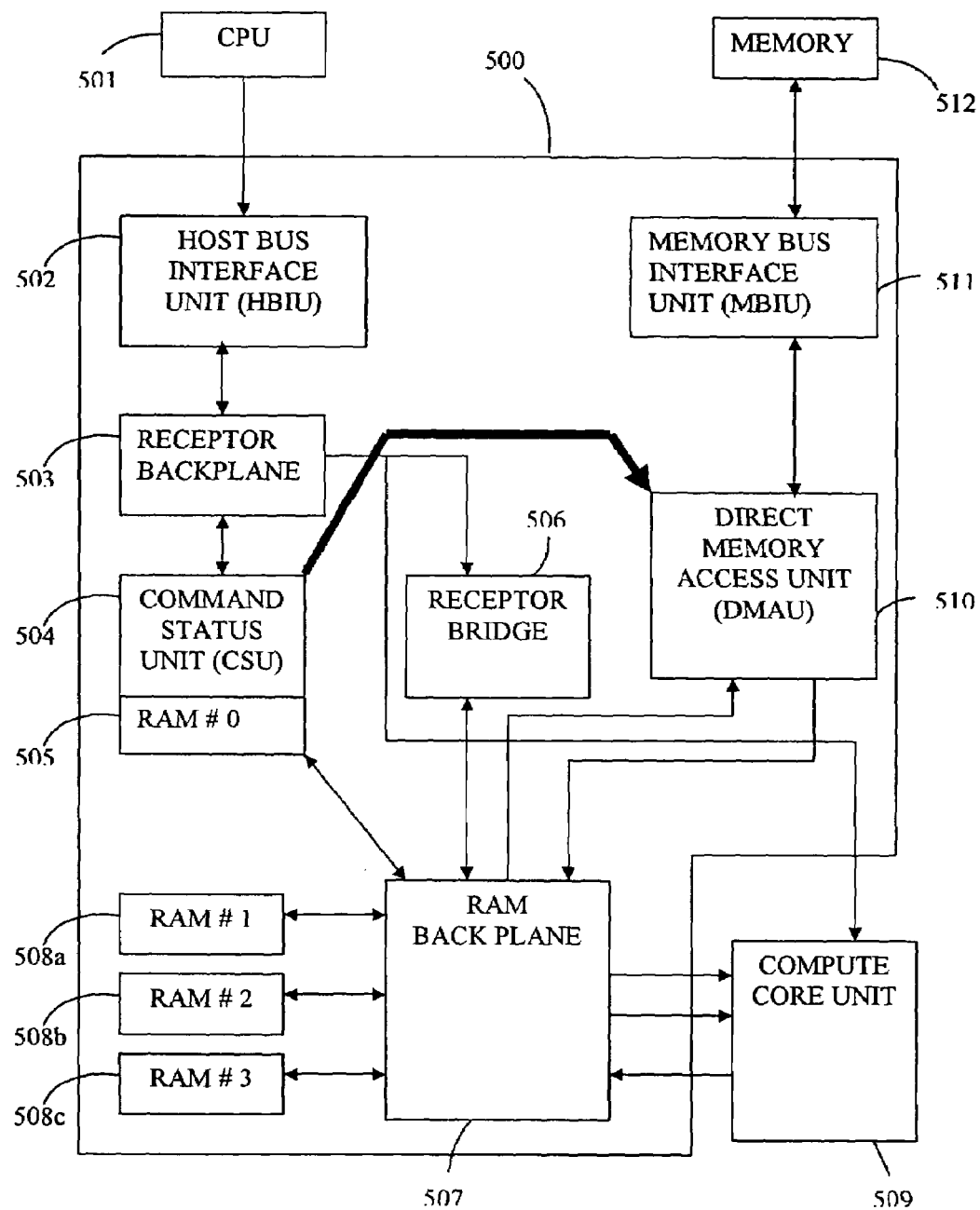
FIG. 10 illustrates the CSU initiating DMAU to perform read operations.

FIG. 10 illustrates the CSU 504 initiating DMAU 510 to start read operations. CSU 504 starts DMAU 510 with read operations through two of its channels. CSU 504 initiates DMAU 510 through a dedicated bus connecting CSU 504 and DMAU 510.

Figure 11:
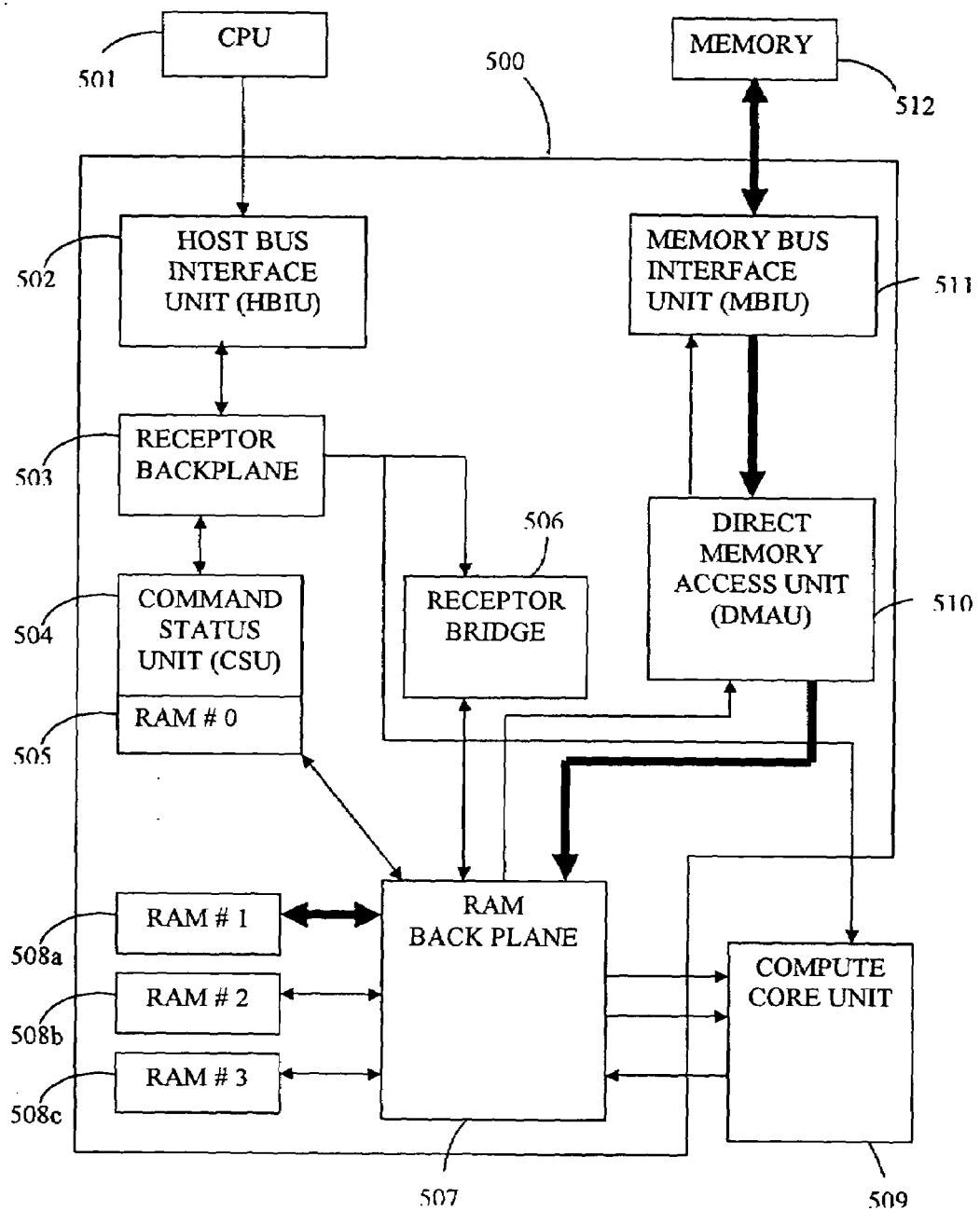
FIG. 11 illustrates DMAU storing X input into the Local Memory Unit through the first channel.

FIG. 11 illustrates DMAU 510 storing X input into the local memory unit RAM #1 508a through the first channel and RAM backplane 507. DMAU 510 starts read operations by requesting bus access for memory read operations. After access is granted, DMAU 510 starts fetching data from memory 512 to local storage memory RAM#1 508a in communication template 500 through a bus and RAM backplane 507.

Figure 12:
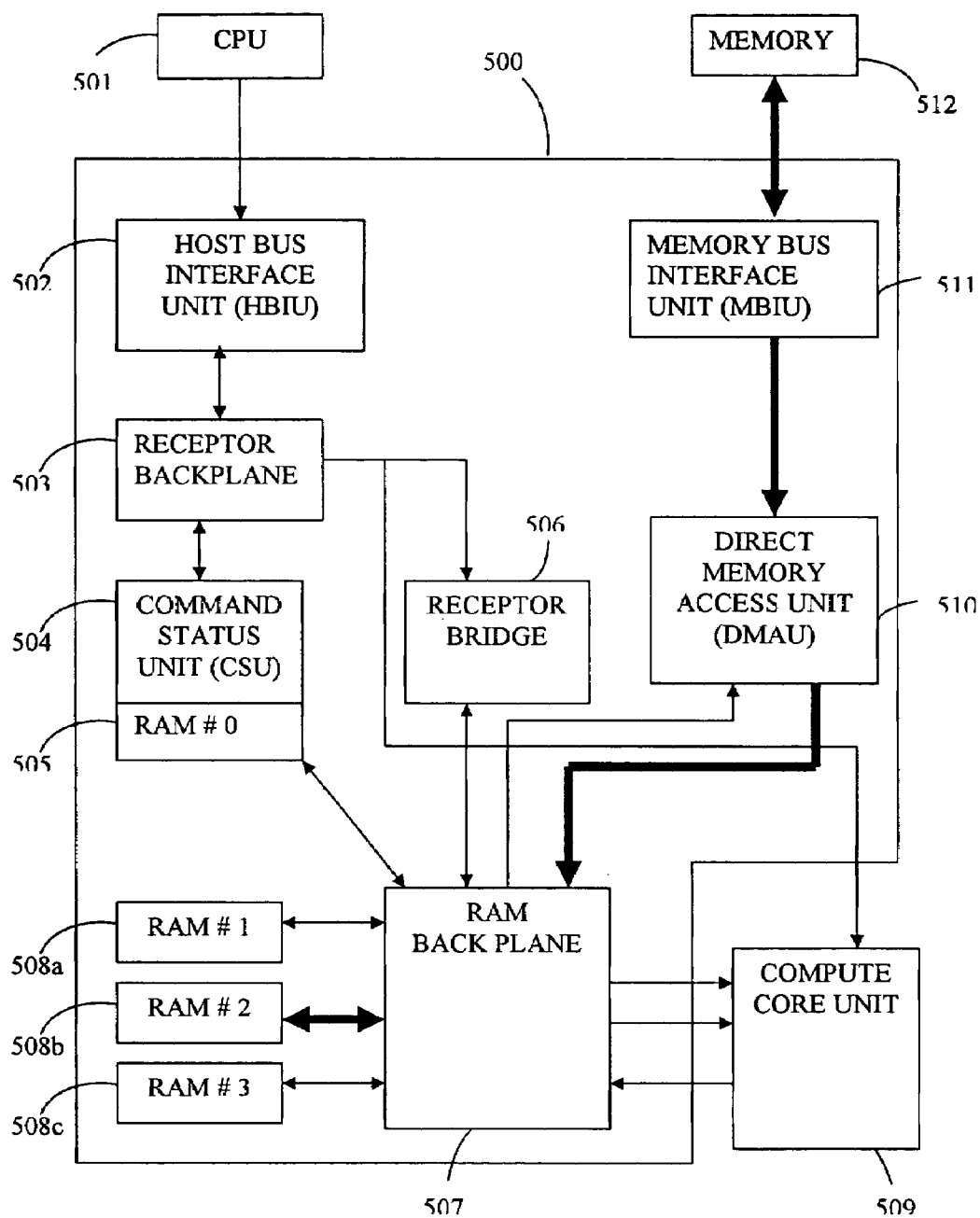
FIG. 12 illustrates DMAU storing Y input into the Local Memory Unit through the second channel.

FIG. 12 illustrates DMAU 510 storing Y input into the Local Memory Unit RAM#2 508b after fetching from the memory 512 through a second channel and RAM backplane 507.

Figure 13:
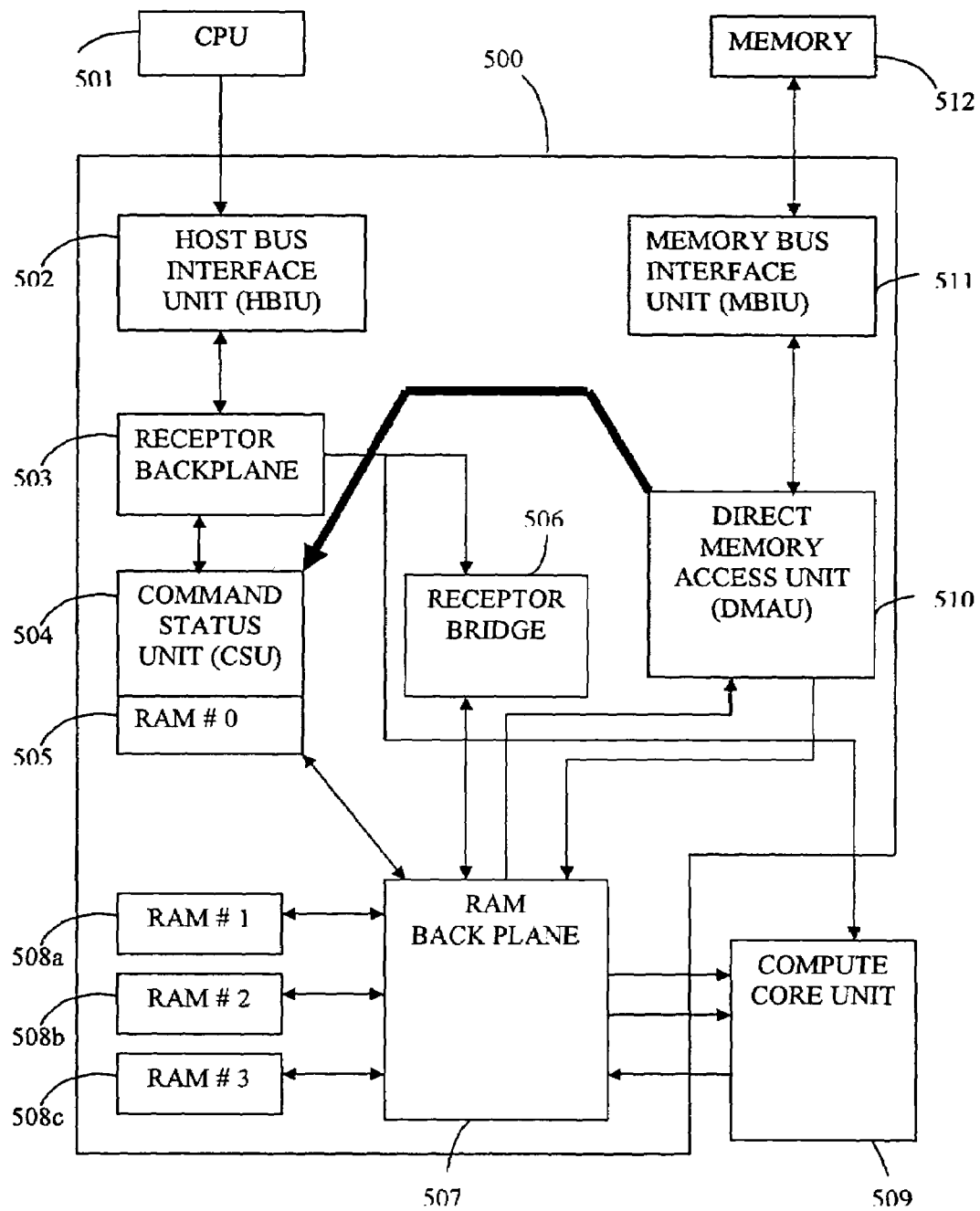
FIG. 13 illustrates the CSU waiting for the acknowledgement of the completion of all DMAU operation.

FIG. 13 illustrates CSU 504 waiting for the acknowledgement of the completion of all DMAU 510 operation. The wait for the acknowledgement is essential in a single-buffered flow of data between DMAU 510 and CCU 509. This sequence is authored differently in order to use double-buffered data flow when application characteristics allow parallel execution of DMAU 510 reads and CCU 509 executions. The sequence is performed through a bus connecting CSU 504 and DMAU 510 directly.

Figure 14:
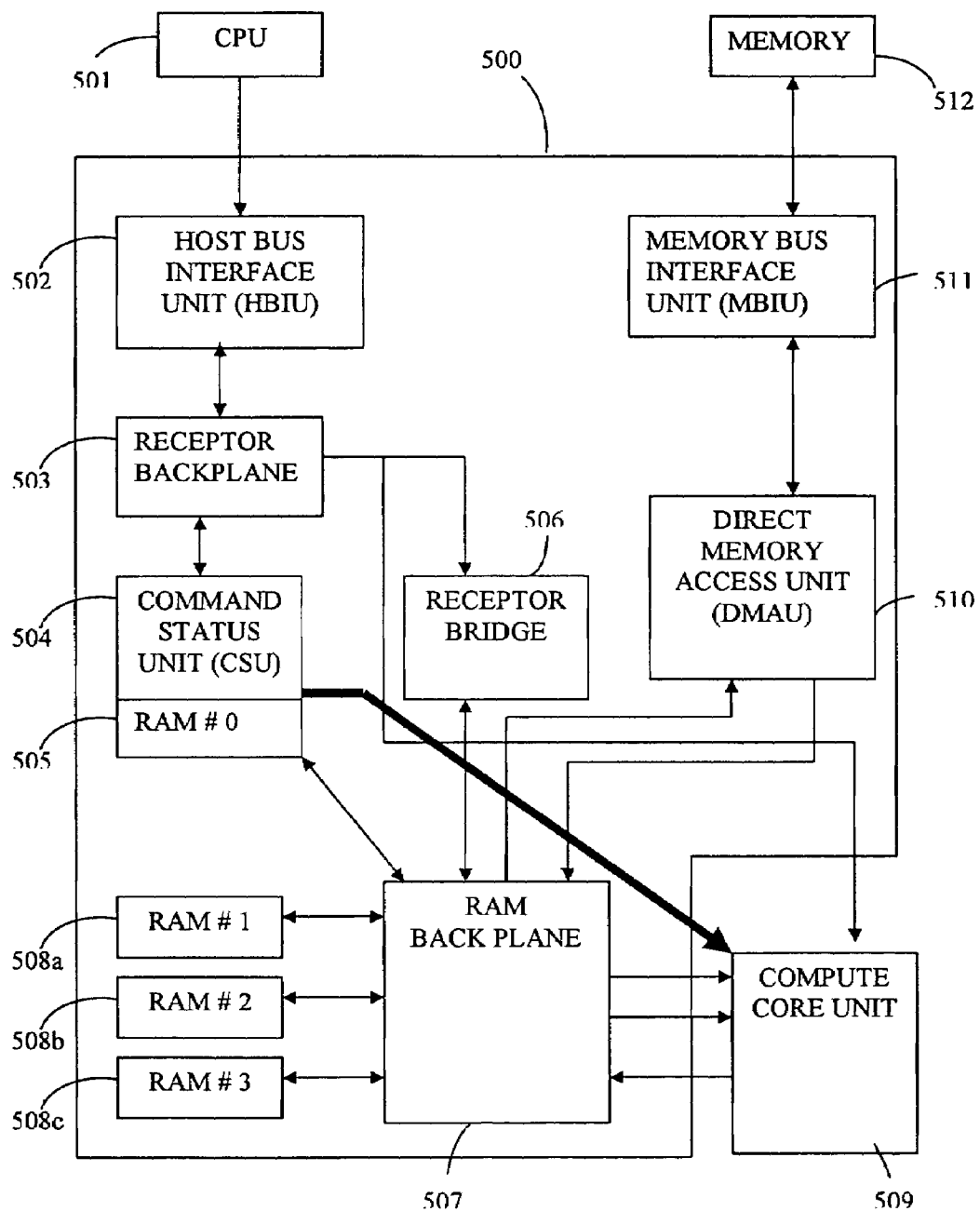
FIG. 14 illustrates the CSU triggering the CCU to start compute operation.

FIG. 14 illustrates CSU 504 triggering the CCU 509 to start computational activity. CSU 504 communicates with CCU 509 by sending a control signal through a bus to initiate the computational process using the data stored in the local memory storage.

Figure 15:
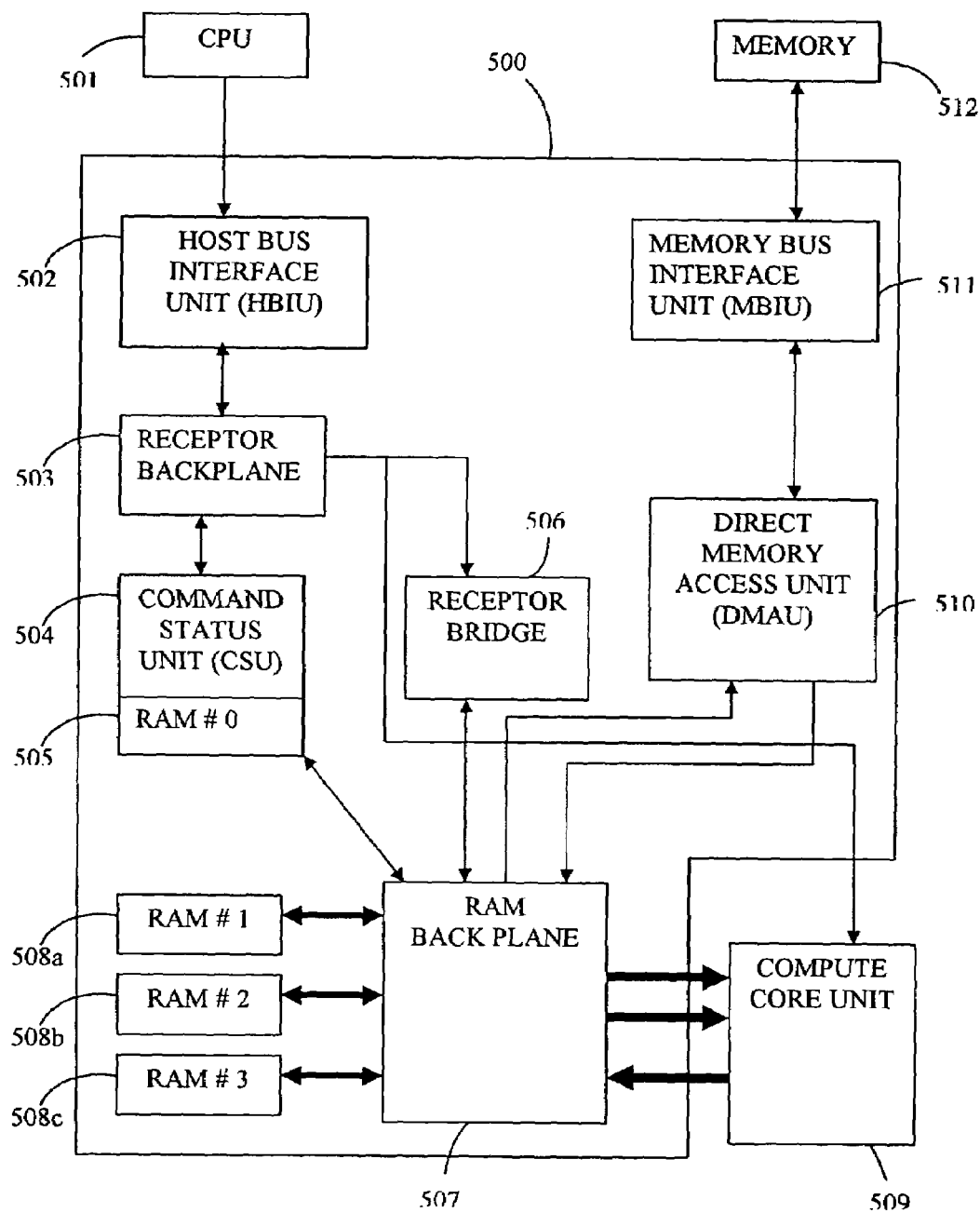
FIG. 15 illustrates the CCU performing a single burst of compute activity and its access to all three Random Access Memory (RAM) units in the LMU (Local Memory Unit).

FIG. 15 illustrates CCU 509 fetching data from the local memory units RAM#1 508a, RAM#2 508b, RAM#3 508c and executing the computational process. The Compute Core is ready to start operation once data is available in the local memory unit. Once CCU 509 receives the signal from CSU 504 indicating the availability of data in the local memory unit, CCU 509 receives the data from the local memory units RAM#1 508a, RAM#2 508b, RAM#3 508c and starts operating on the data.

Figure 16:
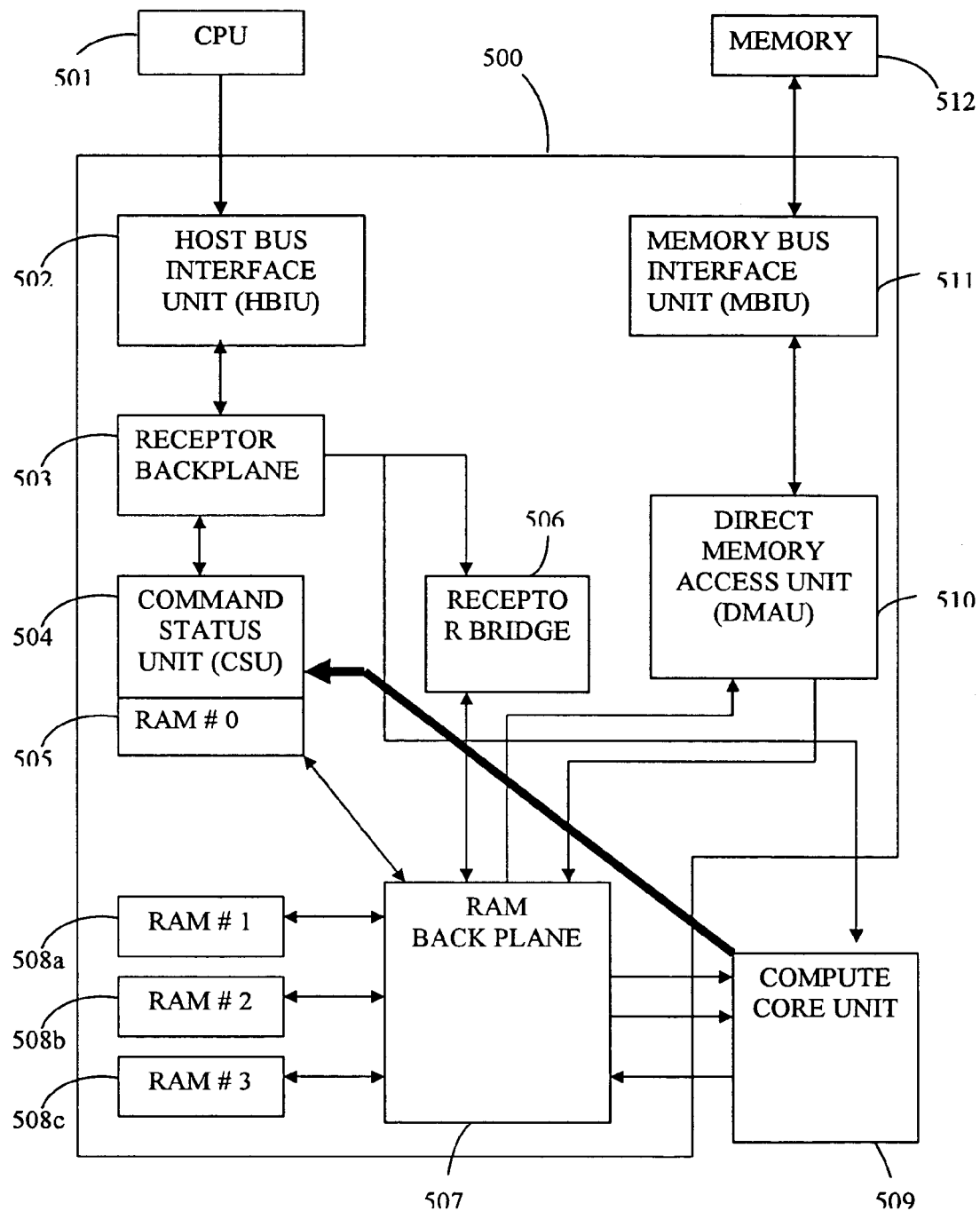
FIG. 16 illustrates the CSU waiting for the acknowledgement of the completion of the CCU activity.

FIG. 16 illustrates CSU 504 waiting for the completion of CCU 509 computational processing. Once the CCU 509 starts the data processing operation, CSU 504 waits for the acknowledgement of completion of CCU 509 activity. This sequence is different if the system allows parallel execution of DMAU 510 writes and Compute Core Unit 509 processes.

Figure 17:
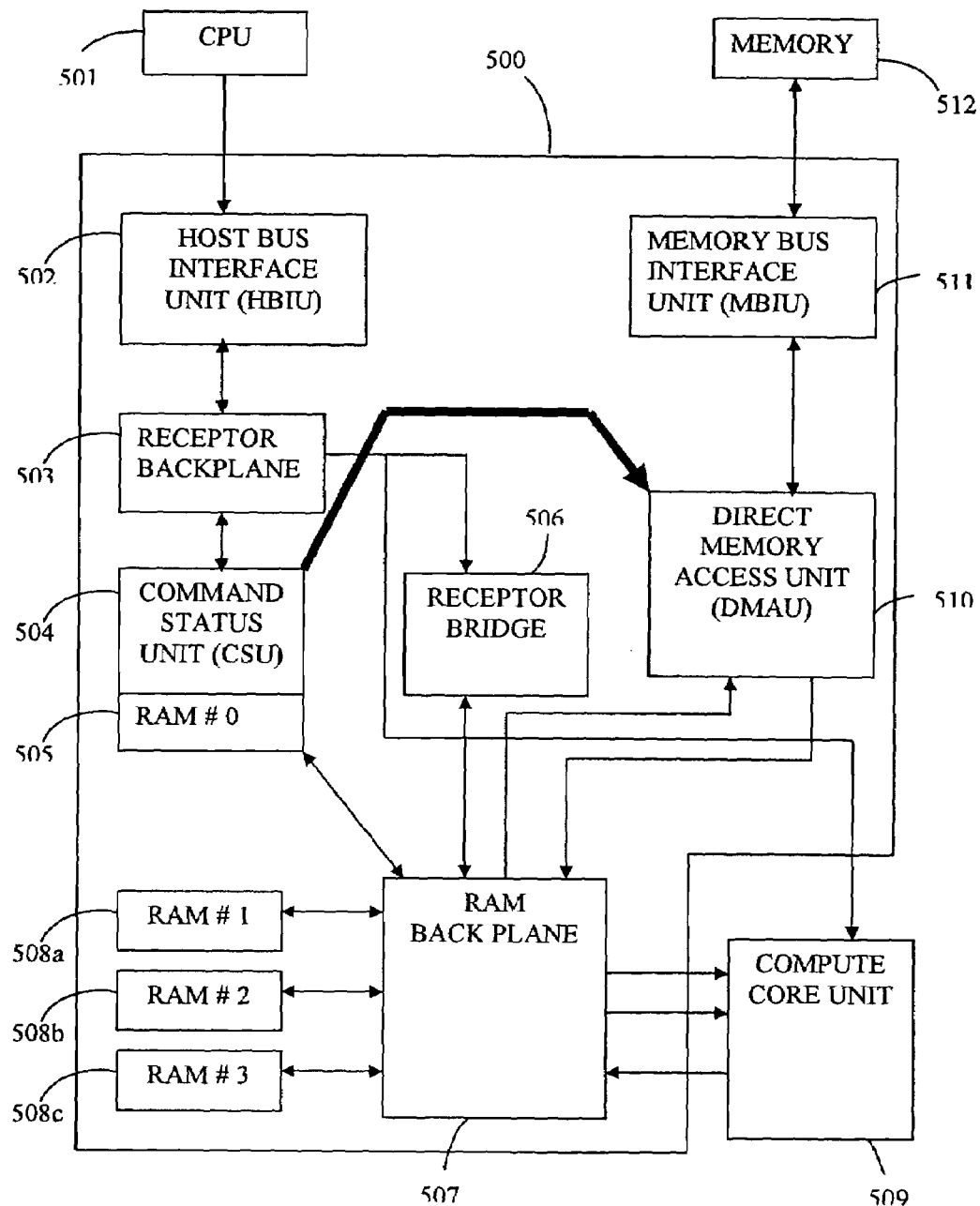
FIG. 17 illustrates the CSU activating the third DMAU channel for writing back of a burst of results from the CCU to memory.

FIG. 17 illustrates CSU 504 issuing command to DMAU 510 for writing back a burst of results computed by CCU 509 from the local memory units 508a, 508b, 508c to the memory 512. DMAU 510 starts by requesting bus access for memory write operation, once access is granted, DMAU 510 starts fetching data from the local memory units 508a, 508b, 508c and writes to memory 512.

Figure 18:
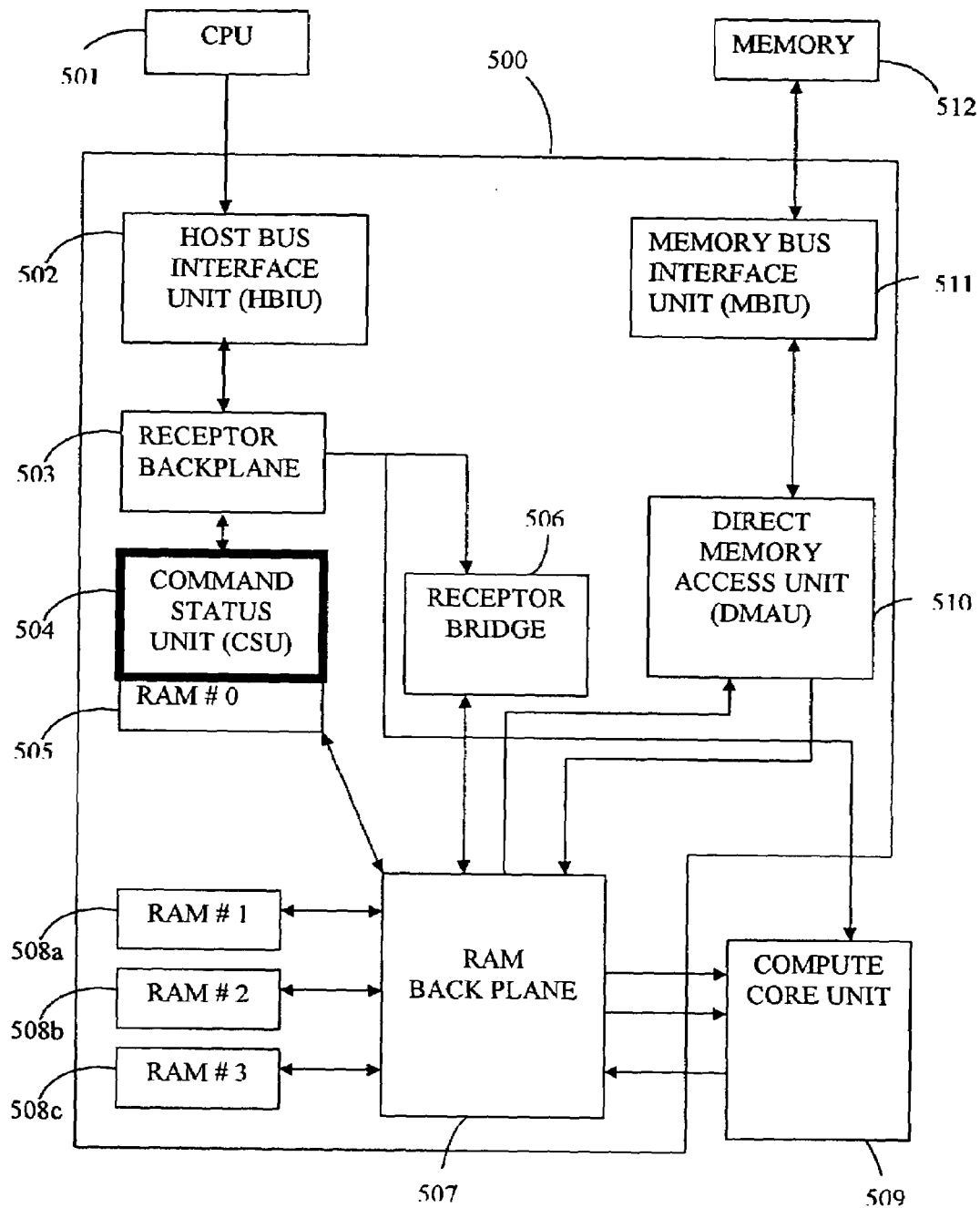
FIG. 18 illustrates the CSU checking for "end loop" conditions.

FIG. 18 illustrates CSU 504 checking for end-loop condition at the CCU 509. In this part of the sequence CSU 504 checks for any iterations of the loop remaining. If loop count were less than three, then steps 6 to 18 of the entire sequence would repeat.

Figure 19:
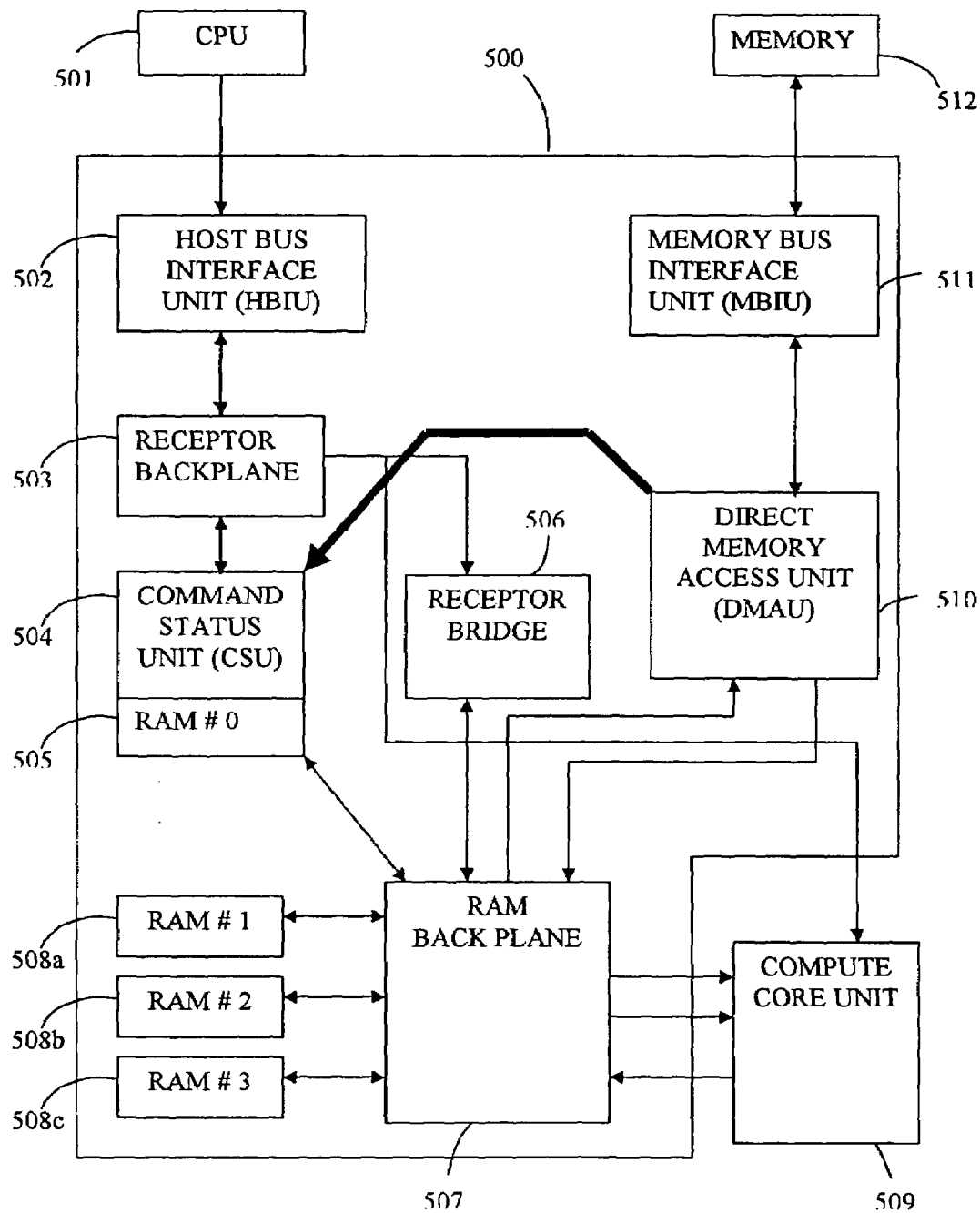
FIG. 19 illustrates the CSU waiting for the acknowledgement of final DMAU write operation.

FIG. 19 illustrates CSU 504 waiting for completion of the final writing by DMAU 510. In this part of the process flow, CSU 504 waits for the acknowledgement of the completion of final writing of results by DMAU 510 into the memory 512.

Figure 20:
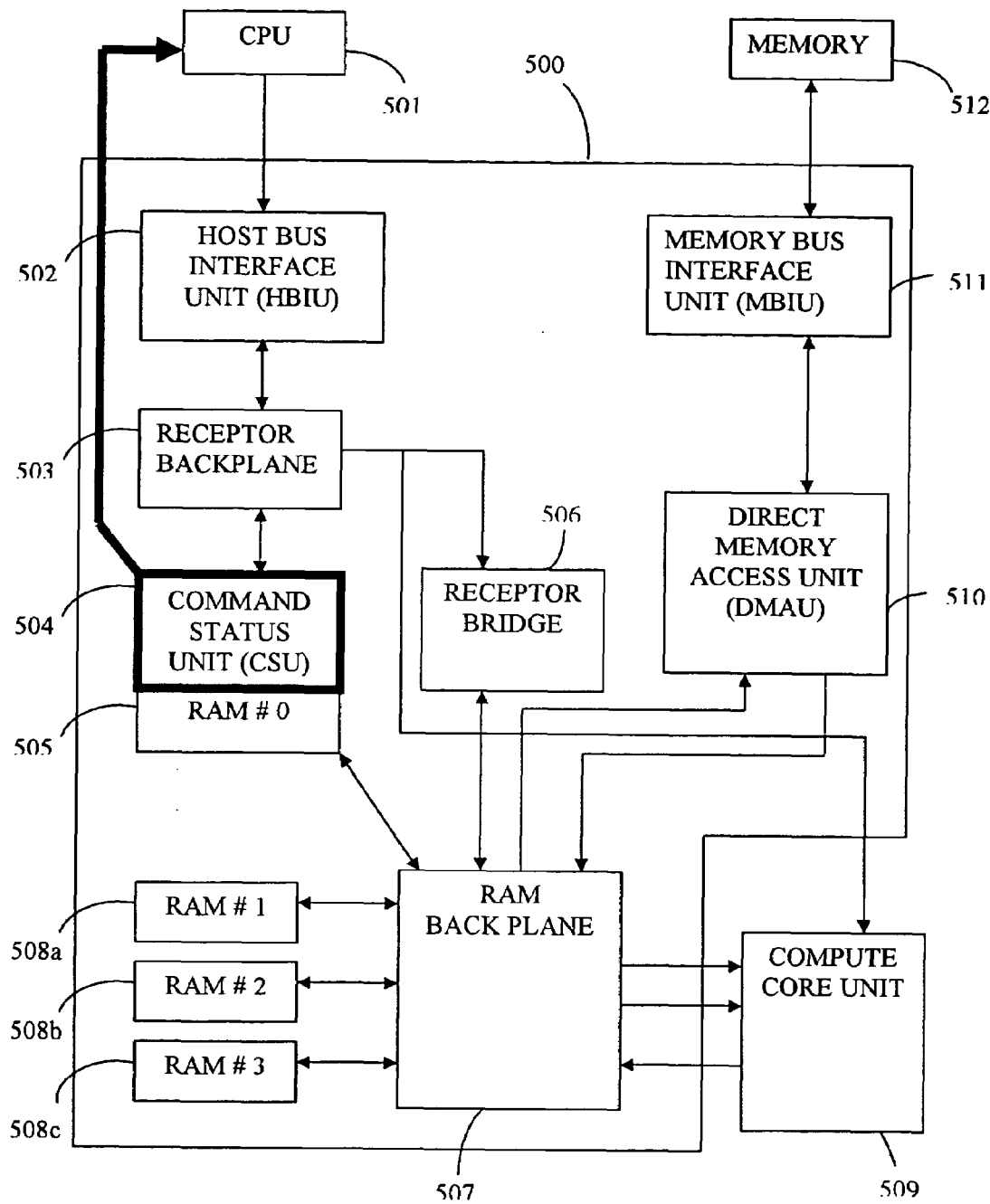
FIG. 20 illustrates the CSU sending a "completion" interrupt to Host.

FIG. 20 illustrates CSU 504 acknowledging the completion of the process to CPU 501. In this part of the sequence, CSU 504 sends "completion" interrupt to CPU 501 with a message.

Figure 21:
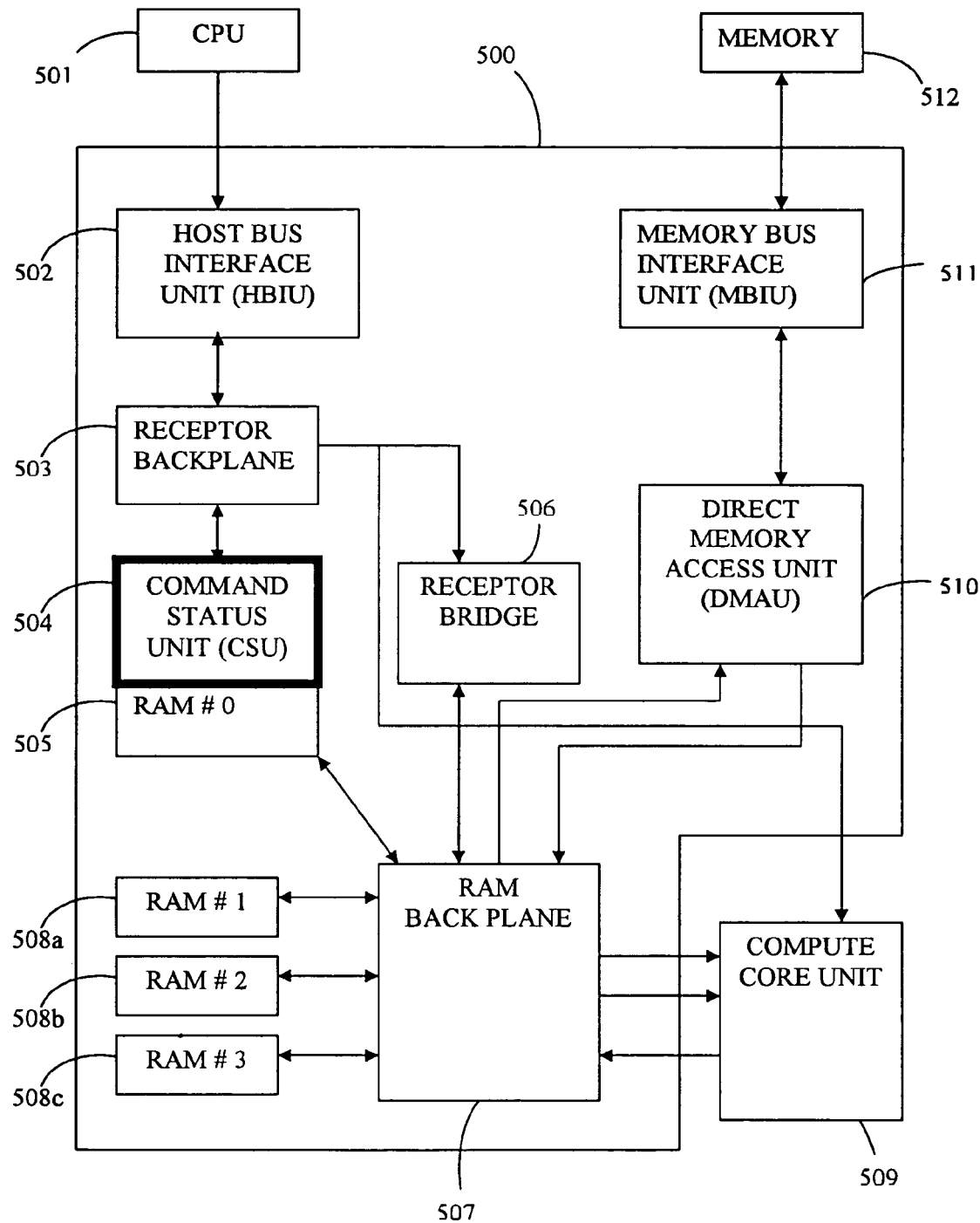
FIG. 21 illustrates the completion and cessation of all activity.

FIG. 21 illustrates the completion and cessation of all activity. The "end" instruction of the sequence stops all activities of the communication template 500. All modules get into "idle" mode.

The unique control flow sequence of the present invention decreases the time for execution of the control snippet. This particular control snippet has realized an improvement in speed of operation of approximately 500%.

Thus, a person skilled in the art will appreciate that the template solution obviates the necessity to recreate the core processor for each new design upgrade. Also, the combination of the various communication elements and the control flow sequence in the communication template improves the overall data transfer speed of the processor-based systems. The configurable bus interface enables the accelerator to be easily portable across different bus architectures.

Being a platform independent tool, the present invention helps the designer to improve the performance of existing platforms of design systems, with minimal cost and effort expenditure.

While the above description contains much specificity, it should not be construed as limitations on the scope of the present invention, but rather as an exemplification of one preferred embodiment thereof Many other variations are possible. Accordingly, the scope of the present invention should be determined not by the embodiment(s) illustrated, but by the appended claims and their legal equivalents

We claim:

1. A system for designing an accelerator of a processor-based system having an external memory unit, and central processing unit, comprising:
   a configurable communication template, further comprising of:
      (a) a configurable host bus unit connecting said accelerator and said processor so as to permit communication there between, for managing the transfers initiated by the processor, to and from the configurable communication template;
      (b) a configurable local memory unit for storing and identifying storage elements local to the configurable communication template;
      (c) a configurable local memory access backplane for managing parallel access paths to the configurable local memory unit; a configurable memory bus unit for connecting the accelerator and said external memory unit;
      (d) a configurable memory bus unit for connecting the accelerator and said external memory unit;
      (e) a configurable direct memory access unit connecting the external memory unit and said configurable local memory unit of the accelerator so as to permit communication there between;
      (f) a configurable and programmable command status unit for setting up and triggering the data flow activities with said direct memory access unit and a compute core unit, and reverting back to said central processing unit; communicating with all the units in the configurable communication template, centrally controlling and coordinating within the configurable communication template;
   whereby, the configurability of the configurable communication template simplifies the accelerator design process, the configurable bus interface enables easy portability of the accelerator across different bus architectures, and the combination of all the communication components in a single configurable communication template increases the speed of data transfer and speed of data control processes in the accelerator; and
   said compute core unit in communication with the configurable communication template for performing arithmetic and logic operations.

2. A method of designing an accelerator, comprising the steps of:
   (a) partitioning an accelerator design into a data communicate module design and a data compute core unit design wherein said data communication module performs communication functions and said data compute core performs arithmetic and logic operations;
   (b) providing a configurable and programmable communication template for use in the design of said data communicate module, wherein said configurable and programmable communication template comprising a host bus unit, a local memory unit, a local memory backplane, a memory bus unit, a direct memory access unit and command status unit;
   (c) customizing the data communicate template as per the specific requirements of the accelerator application, whereby minimal programming effort is required for new accelerator designs; and
   (d) interfacing the data compute core unit manually for each new accelerator design.

3. The method of designing an accelerator according to claim 2, wherein the step of interfacing the data compute core unit is automated.

4. A method for designing an accelerator for an application, comprising the steps of:
   (a) partitioning an accelerator design into a data communicate module design and a data compute core unit design, wherein said data communicate module performs communication functions and said data compute core performs arithmetic and logic operations;
   (b) providing a configurable and programmable communication template for use in the design of the data communicate module, wherein said configurable and programmable communication template comprises a host bus unit, a local memory unit, a local memory backplane, a memory bus unit, a direct memory access unit and a command status unit;
   (c) customizing the data communicate template as per specific requirements of said application, whereby minimal programming effort is required for new accelerator designs, wherein the step of customizing the data communication template comprises:
   configuring said host bus interface unit;
   configuring said memory bus interface unit;
   configuring said direct memory access unit;
   configuring said local memory unit;
   configuring said local storage backplane unit; and
   programming said command status unit as per the requirement of the application for the accelerator; and
   (d) interfacing the data compute core unit manually for each new accelerator design.

5. A method for designing an accelerator, comprising the steps of:
   (a) partitioning an accelerator design into a data communicate module design and a data compute core unit design, wherein said data communicate module performs communication functions and said data compute core performs arithmetic and logic operations;
   (b) providing a configurable and programmable communication template for use in the design of the data communicate module, wherein said configurable and programmable communication template comprises a host bus unit, a local memory unit, a local memory backplane, a memory bus unit, a direct memory access unit and a command status unit;
   (c) customizing the data communicate template as per the specific requirements of the accelerator application, whereby minimal programming effort is required for new accelerator designs, wherein the step of customizing the data communication template comprises:
   configuring said host bus interface unit;
   configuring said memory bus interface unit, wherein configuring the host bus interfacing unit and memory bus interface unit comprises the steps of:
      (i) setting a receptor interface count;
      (ii) setting an initiator interface count;
      (iii) selecting a bus interface protocol standard;
      (iv) setting an address bus width;
      (v) setting a data bus width; and setting a number of clock domains; and
      (vi) setting a number for interfaces;
   configuring said direct memory access unit;
   configuring said local memory unit;
   configuring said local storage backplane unit; and
   programming said command status unit as per the requirement of the application for the accelerator; and
   (d) interfacing the data compute core unit manually for each new accelerator design.

6. A method for designing an accelerator, comprising the steps of:
   (a) partitioning an accelerator design into a data communicate module design and a data compute core unit design, wherein said data communicate module performs communication functions and said data compute core performs arithmetic and logic operations;
   (b) providing a configurable and programmable communication template for use in the design of the data communicate module, wherein said configurable and programmable communication template comprises a host bus unit, a local memory unit, a local memory backplane, a memory bus unit, a direct memory access unit and a command status unit;
   (c) customizing the data communicate template as per the specific requirements of the accelerator application, whereby minimal programming effort is required for new accelerator designs, wherein the step of customizing the data communication template comprises:
   configuring said host bus interface unit;
   configuring said memory bus interface unit;
   configuring said direct memory access unit, wherein said step of configuring the direct memory access unit further comprises the steps of:
      (i) setting a number for channels;
      (ii) setting a burst size limit for each said channel; and
      (iii) setting a direct memory access channel mode;
   configuring said local memory unit;
   configuring said local storage backplane unit; and
   programming said command status unit as per the requirement of the application for the accelerator; and
   (d) interfacing the data compute core unit manually for each new accelerator design.

7. A method for designing an accelerator, comprising the steps of:
   (a) partitioning an accelerator design into a data communicate module design and a data compute core unit design, wherein said data communicate module performs communication functions and said data compute core performs arithmetic and logic operations;

(b) providing a configurable and programmable communication template for use in the design of the data communicate module, wherein said configurable and programmable communication template comprises a host bus unit, a local memory unit, a local memory backplane, a memory bus unit, a direct memory access unit and a command status unit;

(c) customizing the data communicate template as per the specific requirements of the accelerator application, whereby minimal programming effort is required for new accelerator designs, wherein the step of customizing the data communication template comprises:
configuring said host bus interface unit;
configuring said memory bus interface unit;
configuring said direct memory access unit;
configuring said local memory unit, wherein the step of configuring the local memory unit, comprises the steps of:
  (i) setting a total memory size;
  (ii) setting a number for random access memory banks;
  (iii) setting a size for each of said random access memory banks;
  (iv) setting a local address offset for the random access memory banks;
  (v) setting a number for ports to be used for data transfer;
  (vi) setting a type for ports;
  (vii) configuring read and write latencies for said ports; and
  setting a number for buses required for read and write operations;
configuring said local storage backplane unit; and
programming said command status unit as per the requirement of the application for the accelerator; and (d) interfacing the data compute core unit manually for each new accelerator design.

8. A method for designing an accelerator, comprising the steps of:
(d) partitioning an accelerator design into a data communicate module design and a data compute core unit design, wherein said data communicate module performs communication functions and said data compute core performs arithmetic and logic operations;
(e) providing s configurable and programmable communication template for use in the design of the data communicate module, wherein said configurable and programmable communication template comprises a host bus unit, a local memory unit, a local memory backplane, a memory bus unit, a direct memory access unit and a command status unit;
(f) customizing the data communicate template as per the specific requirements of the accelerator application, whereby minimal programming effort is required for new accelerator designs, wherein the step of customizing the data communication template comprises:
configuring said host bus interface unit;
configuring said memory bus interface unit;
configuring said direct memory access unit;
configuring said local memory unit;
configuring said local storage backplane unit; and
programming said command status unit as per the requirement of the application for the accelerator;
configuring said compute core unit, wherein the step of configuring the compute core unit comprises the steps of:
  (i) choosing a single step support;
  (ii) setting a read, write and read write configuration for ports;
  (iii) setting a read write data split;
  (iv) setting a read or write latency;
  (v) choosing a read strobe; and
  (vi) setting a number for concurrent operations;
(d) interfacing the data compute core unit manually for each new accelerator design.

9. A control flow path in an accelerator, comprising:
(a) downloading receptor variables from a central processing unit to a compute core unit, whereby said compute core unit can work on a set of local variables;
(b) downloading control command sequences to a command status unit, whereby said command status unit controls the sequence information required to drive said accelerator for completion of desired activity;
(c) triggering said command status unit to start operation through a receptor variable strobe, whereby the command status unit initializes a direct memory access unit with required parameter settings;
(d) starting said direct memory access unit with read operations;
(e) requesting a bus access for memory read operations;
(f) fetching data from a main memory to a local storage memory in the accelerator once access is granted;
(g) starting a compute core execution;
(h) starting the direct memory access with write operations;
(i) requesting a bus access for memory write operation; and
(j) fetching data from said local storage memory and entering data into an external memory after access is granted.

* * * * *